(12) United States Patent
Kim et al.

(10) Patent No.: US 12,058,912 B2
(45) Date of Patent: Aug. 6, 2024

(54) DISPLAY DEVICE AND METHOD OF REPAIRING THE DISPLAY DEVICE

(71) Applicant: SAMSUNG DISPLAY CO., LTD., Yongin-si (KR)

(72) Inventors: Jonghoon Kim, Yongin-si (KR); Hwayeul Oh, Yongin-si (KR); Joongkeun Lee, Yongin-si (KR); Kidae Shin, Yongin-si (KR); Seokhyun Im, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 452 days.

(21) Appl. No.: 17/393,671

(22) Filed: Aug. 4, 2021

(65) Prior Publication Data
US 2022/0173168 A1    Jun. 2, 2022

(30) Foreign Application Priority Data

Nov. 27, 2020 (KR) ........................ 10-2020-0162679

(51) Int. Cl.
*H10K 59/38* (2023.01)
*H10K 50/86* (2023.01)
(Continued)

(52) U.S. Cl.
CPC ........... *H10K 59/38* (2023.02); *H10K 50/865* (2023.02); *H10K 59/12* (2023.02); *H10K 71/00* (2023.02); *H10K 71/861* (2023.02)

(58) Field of Classification Search
CPC ...... H10K 59/38; H10K 59/12; H10K 59/122; H10K 50/865; H10K 50/86; H10K 50/854;
(Continued)

(56) References Cited

U.S. PATENT DOCUMENTS 10,203,546 B2    2/2019   Chae et al.
2008/0099429 A1  5/2008   Cheng et al.
(Continued)

FOREIGN PATENT DOCUMENTS

JP        2011191362 A      9/2011
KR    1020180008950 A       1/2018
KR    1020200117093 A      10/2020

*Primary Examiner* — Farun Lu
*Assistant Examiner* — Sandra Milena Rodriguez Villan
(74) *Attorney, Agent, or Firm* — CANTOR COLBURN LLP

(57) ABSTRACT

A display device includes: a lower substrate; a display element on the lower substrate and including an emission layer; an upper substrate on the lower substrate with the display element therebetween, where the upper substrate includes a central area overlapping the display element and an adjacent area adjacent to the central area; a bank layer on a lower surface of the upper substrate facing the lower substrate, where a central opening overlapping the central area, an adjacent opening overlapping the adjacent area, and a connection portion connecting the central opening and the adjacent opening to each other are defined in the bank layer; a blocking layer overlapping the connection portion; and a functional layer including at least one selected from a quantum dot and a scatterer, where the functional layer fills the central opening in which a connection to the adjacent opening is blocked by the blocking layer.

10 Claims, 14 Drawing Sheets

(51) Int. Cl.
*H10K 59/12* (2023.01)
*H10K 71/00* (2023.01)

(58) Field of Classification Search
CPC ............... H10K 71/00; H10K 71/861; H10K 2102/331; G02B 5/201
See application file for complete search history.

(56) References Cited

U.S. PATENT DOCUMENTS

2019/0348470 A1\* 11/2019 Song .................. H10K 50/86
2020/0321401 A1 10/2020 Ahn et al.

\* cited by examiner

DISPLAY DEVICE AND METHOD OF REPAIRING THE DISPLAY DEVICE

This application claims priority to Korean Patent Application No. 10-2020-0162679, filed on Nov. 27, 2020, and all the benefits accruing therefrom under 35 U.S.C. § 119, the content of which in its entirety is herein incorporated by reference.

BACKGROUND

1. Field

The disclosure relates to a display device and a method of repairing the display device.

2. Description of the Related Art

Display devices visually display data. Display devices are sometimes used as display units for small-sized products such as mobile phones and the like, or as display units for large-sized products such as televisions and the like.

Display devices may include a plurality of pixels that receive an electrical signal and emit light based thereon, to display an image to an outside. For a full-color display device, a plurality of pixels may emit light of different colors. Accordingly, at least some pixels of the display device may include a filter portion that converts color. Light of a first wavelength band generated in some pixels may be converted into light of a second wavelength band via a corresponding filter portion and emitted to the outside.

SUMMARY

A filter portion of a display device may include a functional layer including at least one of a quantum dot and a scatterer. The functional layer may be filled in an opening defined in a bank layer, and when part of the bank layer is lost, the functional layer may not be filled with a constant thickness in the opening.

One or more embodiments include a display device in which a lost portion of a bank layer is repaired, and a method of repairing the display device capable of repairing the lost portion of the bank layer.

According to an embodiment, a display device includes a lower substrate, a display element disposed on the lower substrate, where the display element includes an emission layer, an upper substrate disposed on the lower substrate with the display element therebetween, the upper substrate includes a central area overlapping the display element and an adjacent area adjacent to the central area, a bank layer disposed on a lower surface of the upper substrate facing the lower substrate, where a central opening overlapping the central area, an adjacent opening overlapping the adjacent area, and a connection portion connecting the central opening and the adjacent opening to each other are defined in the bank layer, a blocking layer overlapping the connection portion, and a functional layer including at least one selected from a quantum dot and a scatterer, where the functional layer fills the central opening in which a connection to the adjacent opening is blocked by the blocking layer.

In an embodiment, the central opening may include a first central opening and a second central opening, the adjacent opening may include a first adjacent opening adjacent to the first central opening, and a second adjacent opening adjacent to the second central opening, the first central opening and the first adjacent opening may be separated from each other, and the second central opening and the second adjacent opening may be connected to each other by the connection portion.

In an embodiment, the bank layer may include a first surface and a second surface facing each other and defining the connection portion, and the blocking layer may be in contact with the first surface and the second surface.

In an embodiment, the central opening may include a first central opening, a second central opening, and a third central opening, the adjacent opening may include a first adjacent opening adjacent to the first central opening, a second adjacent opening adjacent to the second central opening, and a third adjacent opening adjacent to the third central opening, and the functional layer may include a first quantum dot layer filling the first central opening, a second quantum dot layer filling the second central opening, and a transmission layer filling the third central opening.

In an embodiment, the blocking layer and at least one selected from the first quantum dot layer, the second quantum dot layer and the transmission layer may include a same material as each other.

In an embodiment, the display device may further include a color filter layer disposed between the upper substrate and the bank layer, where the color filter layer may include a first color filter, a second color filter, and a third color filter, where the first color filter, the second color filter, and the third color filter may overlap each other, an overlapping portion of the first color filter, the second color filter and the third color filter may define a light-shielding portion, and the light-shielding portion may overlap the adjacent opening.

In an embodiment, the display device may further include a capping layer disposed between the color filter layer and the functional layer.

In an embodiment, the blocking layer may extend from the connection portion to the adjacent opening and fill the adjacent opening.

In an embodiment, the blocking layer may include a first side facing the central opening, and a second side facing the adjacent opening.

According to another embodiment, a display device includes a lower substrate, a display element disposed on the lower substrate, where the display element includes an emission layer, an upper substrate disposed on the lower substrate with the display element therebetween, where the upper substrate includes a central area overlapping the display element and an adjacent area adjacent to the central area, a bank layer disposed on a lower surface of the upper substrate facing the lower substrate, a plurality of central openings overlapping the central area, a plurality of adjacent openings overlapping the adjacent area and adjacent to the plurality of central openings, and a connection portion connecting one of the plurality of central openings and an adjacent one of the plurality of adjacent openings to each other are defined in the bank layer, a functional layer filling the plurality of central openings, where the functional layer include at least one selected from a quantum dot and a scatterer, and a blocking layer overlapping the connection portion.

According to another embodiment, a method of repairing a display device, which includes an upper substrate including a central area and an adjacent area adjacent to the central area, and a bank layer disposed on the upper substrate, where a central opening overlapping the central area, an adjacent opening overlapping the adjacent area, and a connection portion connecting the central opening and the adjacent opening to each other are defined in the bank layer, is provided. In such an embodiment, the method includes providing a blocking layer on the connection portion.

In an embodiment, the providing the blocking layer on the connection portion may include forming the blocking layer on the central opening, the adjacent opening, and the connection portion, and removing another portion of the blocking layer in the central opening.

In an embodiment, the providing the blocking layer on the connection portion may further include removing a portion of the blocking layer in the adjacent opening.

In an embodiment, the removing the portion the blocking layer may include radiating a laser to the portion of the blocking layer.

In an embodiment, the providing the blocking layer on the connection portion may include forming the blocking layer by discharging an ink.

In an embodiment, the central opening may include a first central opening and a second central opening, the adjacent opening may include a first adjacent opening adjacent to the first central opening, and a second adjacent opening adjacent to the second central opening, the first central opening and the first adjacent opening may be separated from each other, the second central opening and the second adjacent opening may be connected to each other by the connection portion, and the method may further include identifying a position of the connection portion.

In an embodiment, the method may further include providing a functional layer including at least one selected from a quantum dot and a scatterer in the central opening in which a connection to the adjacent opening is blocked by the blocking layer.

In an embodiment, the central opening may include a first central opening, a second central opening, and a third central opening, and the providing the functional layer may include providing a first quantum dot layer in the first central opening, providing a second quantum dot layer in the second central opening, and providing a transmission layer in the third central opening.

In an embodiment, the blocking layer and at least one selected from the first quantum dot layer, the second quantum dot layer, and the transmission layer may include a same material as each other.

In an embodiment, the display device may include a color filter layer disposed between the upper substrate and the bank layer, where the color filter layer includes a first color filter, a second color filter, and a third color filter, where the first color filter, the second color filter, and the third color filter may overlap each other, an overlapping portion of the first color filter, the second color filter, and the third color filter may define a light-shielding portion, and the light-shielding portion may overlap the adjacent opening.

BRIEF DESCRIPTION OF THE DRAWINGS

The above and other features of embodiments of the disclosure will be more apparent from the following description taken in conjunction with the accompanying drawings, in which.

DETAILED DESCRIPTION

Figure 1:
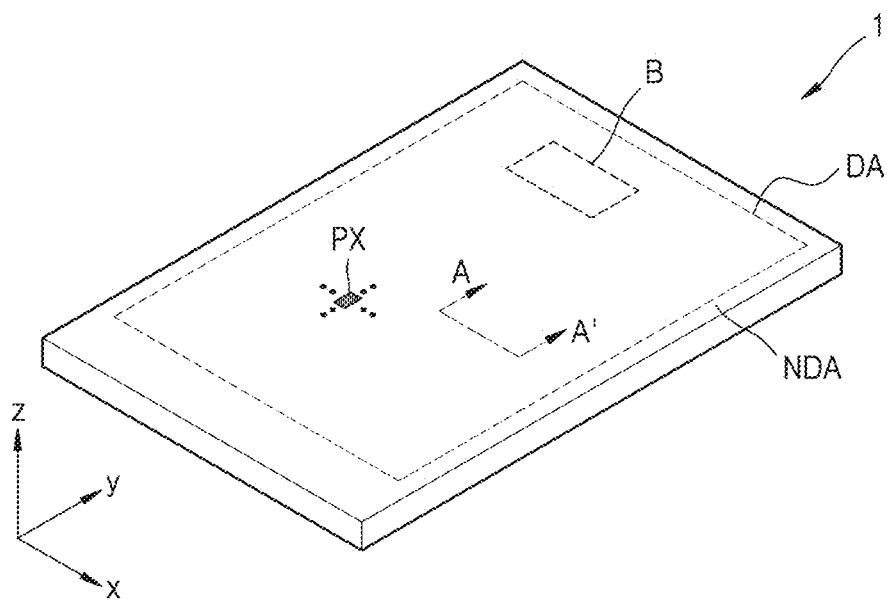
FIG. 1 is a perspective view schematically illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

FIG. 1 is a perspective view schematically illustrating a display device 1 according to an embodiment.

Referring to FIG. 1, an embodiment of the display device 1 may include a display area DA for displaying an image and a non-display area NDA in which no image is displayed. The display device 1 may provide an image to the outside by using light emitted from the display area DA.

In an embodiment, as shown in FIG. 1, the display device 1 may include the display area DA having a quadrilateral shape. In an alternative embodiment, the display area DA may have a shape of a circle, an ellipse, or a polygon such as a triangle or a pentagon. In an embodiment, as shown in FIG. 1, the display device 1 may be a flat-panel display device having a flat shape, but not being limited thereto. Alternatively, the display device 1 may be implemented in various forms such as a display device that is flexible, foldable, or rollable.

In an embodiment, the display device 1 may be an organic light-emitting display device. In an alternative embodiment, the display device 1 may be an inorganic light-emitting display device or a quantum dot light-emitting display device. In one embodiment, for example, an emission layer of a display element included in the display device 1 may include an organic material, may include an inorganic material, may include a quantum dot, may include an organic material and a quantum dot, may include an inorganic material and a quantum dot, or may include an organic material, an inorganic material, and a quantum dot. Hereinafter, for convenience of description, embodiments where the display device 1 is an organic light-emitting display device will be described in detail.

A plurality of pixels PX may be arranged in the display area DA. Herein, the pixels PX refer to sub-pixels that emit light of different colors, and for example, each of the pixels PX may be one of a red sub-pixel, a green sub-pixel, and a blue sub-pixel.

Figure 2:
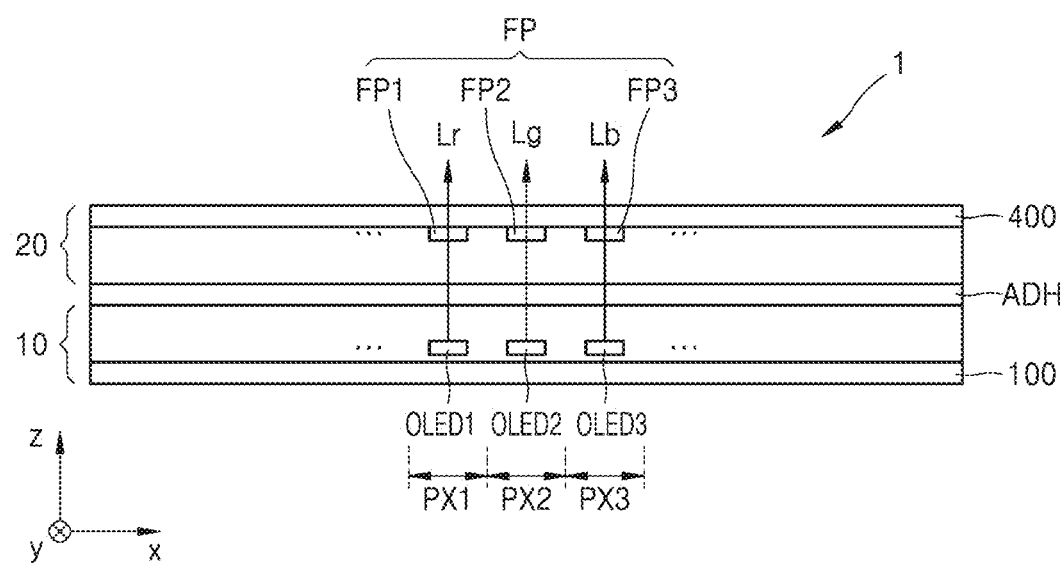
FIG. 2 is a cross-sectional view schematically illustrating a display device according to an embodiment.

FIG. 2 is a cross-sectional view schematically illustrating a display device 1 according to an embodiment.

Referring to FIG. 2, an embodiment of the display device 1 may include a first pixel PX1, a second pixel PX2, and a third pixel PX3. The first pixel PX1, the second pixel PX2, and the third pixel PX3 may be pixels emitting light of different colors from each other. In one embodiment, for example, the first pixel PX1 may emit red light (Lr), the second pixel PX2 may emit green light (Lg), and the third pixel PX3 may emit blue light (Lb).

In an embodiment, the display device 1 may include a display panel 10 and a color conversion panel 20. The display panel 10 may include a lower substrate 100 and a display element. In one embodiment, for example, the display element may be an organic light-emitting diode. In an embodiment, each of the first pixel PX1, the second pixel PX2, and the third pixel PX3 may include an organic light-emitting diode. In one embodiment, for example, the first pixel PX1 may include a first organic light-emitting diode OLED1. In such an embodiment, the second pixel PX2 may include a second organic light-emitting diode OLED2, and the third pixel PX3 may include a third organic light-emitting diode OLED3.

In an embodiment, each of the first organic light-emitting diode OLED1, the second organic light-emitting diode OLED2, and the third organic light-emitting diode OLED3 may emit blue light. In an alternative embodiment, the first organic light-emitting diode OLED1, the second organic light-emitting diode OLED2, and the third organic light-emitting diode OLED3 may emit red light (Lr), green light (Lg), and blue light (Lb), respectively.

The color conversion panel 20 may include an upper substrate 400 and a filter portion FP. In an embodiment, the filter portion FP may include a first filter portion FP1, a second filter portion FP2, and a third filter portion FP3. Light emitted from the first organic light-emitting diode OLED1 may be emitted as red light (Lr) via the first filter portion FP1. Light emitted from the second organic light-emitting diode OLED2 may be emitted as green light (Lg) via the second filter portion FP2. Light emitted from the third organic light-emitting diode OLED3 may be emitted as blue light (Lb) via the third filter portion FP3.

In an embodiment, the filter portion FP may include a functional layer and a color filter layer. In an embodiment, the functional layer may include a first quantum dot layer, a second quantum dot layer, and a transmission layer. In an embodiment, the color filter layer may include a first color filter, a second color filter, and a third color filter. The first filter portion FP1 may include the first quantum dot layer and the first color filter. The second filter portion FP2 may include the second quantum dot layer and the second color filter. The third filter portion FP3 may include the transmission layer and the third color filter.

In an embodiment, the filter portion FP may be located directly on the upper substrate 400. In this case, "located directly on the upper substrate 400" may mean manufacturing the color conversion panel 20 by forming the first color filter, the second color filter, and the third color filter directly on the upper substrate 400. Thereafter, the color conversion panel 20 may be bonded to the display panel 10 so that the first filter portion FP1, the second filter portion FP2, and the third filter portion FP3 face the first organic light-emitting diode OLED1, second organic light-emitting diode OLED2, and third organic light-emitting diode OLED3, respectively.

In an embodiment, as shown in FIG. 2, the display panel 10 and the color conversion panel 20 are bonded together through an adhesive layer ADH. In one embodiment, for example, the adhesive layer ADH may be an optical clear adhesive ("OCA"). In an alternative embodiment, the display panel 10 may be bonded to the color conversion panel 20 by using a filler. In an alternative embodiment, the adhesive layer ADH and the filler may be omitted.

Figure 3:
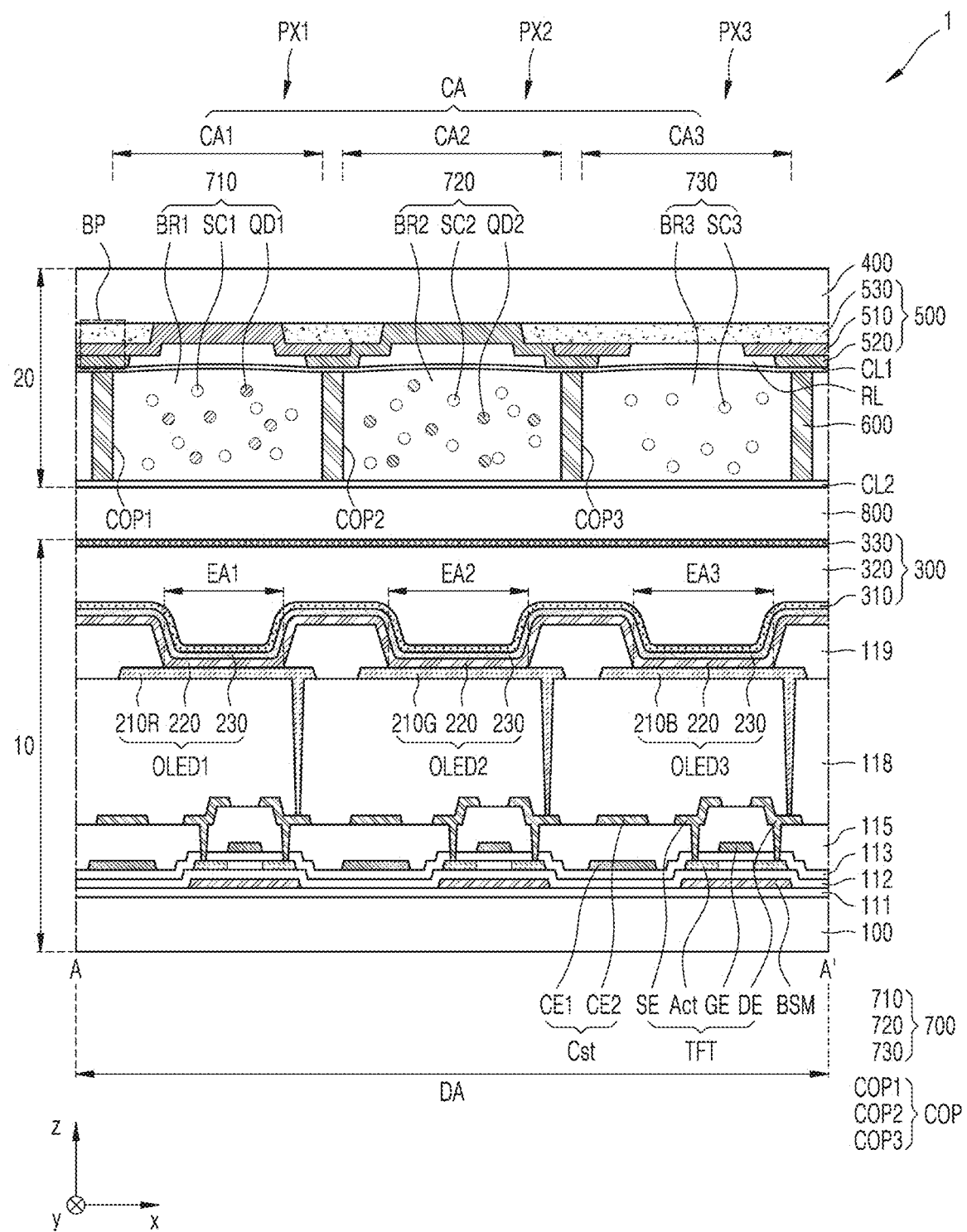
FIG. 3 is a cross-sectional view schematically illustrating a display device according to an embodiment.

FIG. 3 is a cross-sectional view schematically illustrating a display device 1 according to an embodiment. FIG. 3 is a cross-sectional view of the display device 1 in FIG. 1, taken along line A-A', according to an embodiment.

Referring to FIG. 3, an embodiment of the display device 1 may include a first pixel PX1, a second pixel PX2, and a third pixel PX3 in a display area DA. However, this is an example, and the display device 1 may include more pixels. FIG. 3 shows that the first pixel PX1, the second pixel PX2, and the third pixel PX3 are adjacent to each other, but not being limited thereto. In an alternative embodiment, the first pixel PX1, the second pixel PX2, and the third pixel PX3 may not be adjacent to one another.

The first pixel PX1, the second pixel PX2, and the third pixel PX3 may emit light of different colors from each other. In one embodiment, for example, the first pixel PX1 may emit red light, the second pixel PX2 may emit green light, and the third pixel PX3 may emit blue light.

In an embodiment, the display device 1 may include a display panel 10 and a color conversion panel 20. The display panel 10 may include a lower substrate 100 and a display element arranged or disposed on the lower substrate 100. The display element may include an emission layer 220. In an embodiment, the display panel 10 may include a first organic light-emitting diode OLED1, a second organic light-emitting diode OLED2, and a third organic light-emitting diode OLED3 on the lower substrate 100. Each of the first organic light-emitting diode OLED1, the second organic light-emitting diode OLED2, and the third organic light-emitting diode OLED3 may include the emission layer 220.

A stacked structure of the display panel 10 will hereinafter be described below in detail.

In an embodiment, the lower substrate 100 may include a glass material, a ceramic material, a metal material, or a material that is flexible or bendable. In an embodiment, where the lower substrate 100 is flexible or bendable, the lower substrate 100 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. The lower substrate 100 may have a single layer or a multi-layer structure, in which each layer includes at least one selected from the aforementioned materials, and the lower substrate 100 having a multi-layer structure may further include an inorganic layer. In an embodiment, the lower substrate 100 may have a structure of an organic material, an inorganic material, and another organic material.

A barrier layer (not shown) may be further included between the lower substrate 100 and a first buffer layer 111. The barrier layer may prevent or minimize the penetration of impurities from the lower substrate 100 and the like into a semiconductor layer Act. The barrier layer may include an inorganic material such as an oxide or a nitride, may include an organic material, or may include an organic-inorganic composite, and may have a single layer or multi-layered structure of an inorganic material and an organic material.

A bias electrode BSM may be arranged or disposed on the first buffer layer 111 to correspond to a thin-film transistor TFT. In an embodiment, a voltage may be applied to the bias electrode BSM. In such an embodiment, the bias electrode BSM may prevent external light from reaching the semiconductor layer Act. Thus, characteristics of the thin-film transistor TFT may be stabilized. Alternatively, the bias electrode BSM may be omitted.

The semiconductor layer Act may be arranged or disposed on a second buffer layer 112. The semiconductor layer Act may include amorphous silicon or polysilicon. In an alternative embodiment, the semiconductor layer Act may include an oxide of at least one material selected from indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). In an embodiment, the semiconductor layer Act may be formed of a Zn oxide-based material, such as a Zn oxide, an In—Zn oxide, and a Ga—In—Zn oxide. In an alternative embodiment, the semiconductor layer Act may be In—Ga—Zn—O ("IGZO") semiconductor, In—Sn—Zn—O ("ITZO") semiconductor, or In—Ga—Sn—Zn—O ("IGTZO") semiconductor containing metal such as indium (In), gallium (Ga), and tin (Sn) in ZnO. The semiconductor layer Act may include a channel area, a source area, and a drain area, wherein the source area and the drain area are arranged at opposite sides of the channel area, respectively. The semiconductor layer Act may have a single layer structure or a multilayer structure.

A gate electrode GE may be arranged or disposed on the semiconductor layer Act with a gate insulating layer 113 therebetween. The gate electrode GE may at least partially overlap the semiconductor layer Act. The gate electrode GE includes molybdenum (Mo), aluminum (Al), copper (Cu), titanium (Ti), and the like, and may include a single layer or multiple layers. In one embodiment, for example, the gate electrode GE may be a single Mo layer. A first electrode CE1 of a storage capacitor Cst and the gate electrode GE may be arranged or disposed in a same layer as each other. The first electrode CE1 and the gate electrode GE may include a same material as each other.

In an embodiment, as shown in FIG. 3, the gate electrode GE of the thin-film transistor TFT and the first electrode CE1 of the storage capacitor Cst may be separately arranged, but not being limited thereto. In an alternative embodiment, the storage capacitor Cst may overlap the thin-film transistor TFT. In such an embodiment, the gate electrode GE of the thin-film transistor TFT may function as the first electrode CE1 of the storage capacitor Cst.

An interlayer insulating layer 115 may be provided to cover the gate electrode GE and the first electrode CE1 of the storage capacitor Cst. The interlayer insulating layer 115 may include silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

A second electrode CE2 of the storage capacitor Cst, a source electrode SE, and a drain electrode DE may be arranged or disposed on the interlayer insulating layer 115.

The second electrode CE2 of the storage capacitor Cst, the source electrode SE, and the drain electrode DE may include a conductive material including molybdenum (Mo), aluminum (Al), copper (Cu), titanium (Ti), etc., and may have a single layer structure or a multilayer structure, in which each layer includes at least one selected from the aforementioned conductive materials. In one embodiment, for example, each of the second electrode CE2, the source electrode SE, and the drain electrode DE may have a multi-layer structure of a Ti layer, an Al layer, and another Ti layer. The source electrode SE and the drain electrode DE may be respectively connected to a source area or a drain area of the semiconductor layer Act through a contact hole.

The second electrode CE2 of the storage capacitor Cst overlaps the first electrode CE1 with the interlayer insulating layer 115 therebetween, and the first and second electrode CE1 and CE2 may collectively form or define the storage capacitor Cst. In such an embodiment, the interlayer insulating layer 115 may function as a dielectric layer of the storage capacitor Cst.

A planarization layer 118 may be arranged or disposed on the second electrode CE2 of the storage capacitor Cst, the source electrode SE, and the drain electrode DE. In the planarization layer 118, a film including an organic material may be formed as a single layer or multiple layers, and the planarization layer 118 may provide a flat upper surface. The planarization layer 118 may include at least one selected from a general-purpose polymer such as benzocyclobutene ("BCB"), polyimide, hexamethyldisiloxane ("HMDSO"), poly(methyl methacrylate) ("PMMA") or polystyrene ("PS"), a polymer derivative having a phenol-based group, an acryl-based polymer, an imide-based polymer, aryl-ether-based polymer, an amide-based polymer, a fluorine-based polymer, a p-xylene-based polymer, a vinyl alcohol-based polymer, and a combination (e.g., a blend) thereof.

The display element may be arranged or disposed on the planarization layer 118. In an embodiment, the first organic light-emitting diode OLED1, the second organic light-emitting diode OLED2, and the third organic light-emitting diode OLED3 may be arranged or disposed on the planarization layer 118. The first organic light-emitting diode OLED1, the second organic light-emitting diode OLED2, and the third organic light-emitting diode OLED3 may include a first pixel electrode 210R, a second pixel electrode 210G, and a third pixel electrode 210B, respectively. In an embodiment, the first organic light-emitting diode OLED1, the second organic light-emitting diode OLED2, and the third organic light-emitting diode OLED3 may commonly include the emission layer 220 and an opposite electrode 230.

Each of the first pixel electrode 210R, the second pixel electrode 210G, and the third pixel electrode 210B may be a (semi-)light-transmitting electrode or a reflective electrode. In an embodiment, each of the first pixel electrode 210R, the second pixel electrode 210G, and the third pixel electrode 210B may include a reflective layer and a transparent or translucent electrode layer disposed on the reflective layer, where the reflective layer includes at least one selected from silver (Ag), magnesium (Mg), aluminum (Al), platinum (Pt), palladium (Pd), gold (Au), nickel (Ni), neodymium (Nd), iridium (Ir), chromium (Cr), and a compound thereof. In such an embodiment, the transparent or translucent electrode layer may include at least one selected from indium tin oxide ("ITO"), indium zinc oxide ("IZO"), zinc oxide (ZnO), indium oxide ($In_2O_3$), indium gallium oxide ("IGO"), and aluminum zinc oxide ("AZO"). In one embodiment, for example, each of a first pixel electrode 210R, a second pixel electrode 210G, and a third pixel electrode 210B may have a multilayer structure of an ITO layer, an Ag layer, and another ITO layer.

A pixel-defining layer 119 may be arranged or disposed on the planarization layer 118. Openings that respectively expose central portions of the first pixel electrode 210R, the second pixel electrode 210G, and the third pixel electrode 210B may be defined through the pixel-defining layer 119. The pixel-defining layer 119 may cover edges of the first pixel electrode 210R, the second pixel electrode 210G, and the third pixel electrode 210B. The pixel-defining layer 119 may prevent an arc, etc. from occurring or being formed at the edges of first pixel electrode 210R, the second pixel electrode 210G, and the third pixel electrode 210B by increasing a distance between each of the edges of the first pixel electrode 210R, the second pixel electrode 210G, and the third pixel electrode 210B and the opposite electrode 230 above the first pixel electrode 210R, the second pixel electrode 210G, and the third pixel electrode 210B.

The pixel-defining layer 119 may include at least one organic insulation material selected from polyimide, polyamide, an acryl-based resin, BCB, and a phenol-based resin, and may be formed by a method such as a spin coating.

The emission layer 220 of each of the first organic light-emitting diode OLED1, second organic light-emitting diode OLED2, and third organic light-emitting diode OLED3 may include an organic material containing a fluorescent or phosphorescent material for emitting one of red light, green light, blue light, and white light. The emission layer 220 may be a low-molecular-weight organic material or a polymer organic material, and below and above the emission layer 220, a functional layer, such as a hole transport layer ("HTL"), a hole injection layer ("HIL"), an electron transport layer ("ETL"), and an electron injection layer ("EIL"), may be optionally further arranged. In an embodiment, as shown in FIG. 3, the emission layer 220 is formed as a single body throughout the first pixel electrode 210R, the second pixel electrode 210G, and the third pixel electrode 210B, but the disclosure is not limited thereto. Alternatively, the emission layer 220 may be variously modified, e.g., to be arranged to correspond to each of the first pixel electrode 210R, the second pixel electrode 210G, and the third pixel electrode 210B.

In an embodiment, as described above, the emission layer 220 may include a layer that is integrally formed as a single unitary body throughout the first pixel electrode 210R, the second pixel electrode 210G, and the third pixel electrode 210B. Alternatively, the emission layer 220 may include a layer that is patterned to correspond to each of the first pixel electrode 210R, the second pixel electrode 210G, and the third pixel electrode 210B. In such embodiments, the emission layer 220 may include a first color emission layer. The first color emission layer may be a single unitary body integrally formed across the first pixel electrode 210R, the second pixel electrode 210G, and the third pixel electrode 210B, and may be selectively patterned to correspond to each of the first pixel electrode 210R, the second pixel electrode 210G, and the third pixel electrode 210B. The first color emission layer may emit light of a first wavelength band, and for example, may emit light of a wavelength in a range of about 450 nanometers (nm) to about 495 nm.

The opposite electrode 230 may be arranged or disposed on the emission layer 220 to correspond to each of the first pixel electrode 210R, the second pixel electrode 210G, and the third pixel electrode 210B. The opposite electrode 230 may be integrally formed as a single unitary body with a plurality of organic light-emitting diodes. In an embodiment, the opposite electrode 230 may be a transparent or translucent electrode, and may include a metal thin film having a low work function that contains at least one selected from lithium (Li), calcium (Ca), LiF/Ca, LiF/Al, Al, Ag, Mg, and a compound thereof. In an embodiment, a transparent conductive oxide ("TCO") film including ITO, IZO, ZnO, or $In_2O_3$ may be further arranged or disposed on the metal thin film.

In an embodiment, first light may be generated in a first emission area EA1 of the first organic light-emitting diode OLED1 and emitted to an outside. The first emission area EA1 may be defined by a portion of the first pixel electrode 210R that is exposed by an opening in the pixel-defining layer 119. Second light may be generated in a second emission area EA2 of the second organic light-emitting diode OLED2 and emitted to the outside. The second emission area EA2 may be defined by a portion of the second pixel electrode 210G that is exposed by an opening in the pixel-defining layer 119. Third light may be generated in a third emission area EA3 of the third organic light-emitting diode OLED3 and emitted to the outside. The third emission area EA3 may be defined by a portion of the third pixel electrode 210B that is exposed by an opening in the pixel-defining layer 119.

The first emission area EA1, the second emission area EA2, and the third emission area EA3 may be spaced apart from one another. An area of the display area DA excluding the first emission area EA1, the second emission area EA2, and the third emission area EA3 may be a non-emission area. The first emission area EA1, the second emission area EA2, and the third emission area EA3 may be distinguished by the non-emission area. In a plan view, the first emission area EA1, the second emission area EA2, and the third emission area EA3 may be in one of various arrangements, such as a stripe arrangement and a pentile arrangement. In a plan view, each of the first emission area EA1, the second emission area EA2, and the third emission area EA3 may have a shape of one of a polygon, a circle, and an ellipse.

A spacer (not shown) for preventing masking defects may be further included on the pixel-defining layer 119. The spacer may be integrally formed as a single unitary body with the pixel-defining layer 119. In one embodiment, for example, the spacer and the pixel-defining layer 119 may be simultaneously formed in a same process using a half tone mask process.

The first organic light-emitting diode OLED1, the second organic light-emitting diode OLED2, and the third organic light-emitting diode OLED3 may be easily damaged by moisture or oxygen from the outside, and may thus be covered with an encapsulation layer 300 to be protected. The encapsulation layer 300 may cover the display area DA and extend to the outside of the display area DA. The encapsulation layer 300 may include at least one organic encapsulation layer and at least one inorganic encapsulation layer. In one embodiment, for example, the encapsulation layer 300 may include a first inorganic encapsulation layer 310, an organic encapsulation layer 320, and a second inorganic encapsulation layer 330.

The first inorganic encapsulation layer 310 is formed along a structure therebelow, and thus, may not have a flat upper surface. The organic encapsulation layer 320 covers the first inorganic encapsulation layer 310, and may have an approximately flat upper surface unlike the first inorganic encapsulation layer 310.

Each of the first inorganic encapsulation layer 310 and the second inorganic encapsulation layer 330 may include at least one inorganic material selected from $Al_2O_3$, $TiO_2$, $Ta_2O_5$, $HfO_2$, ZnO, $SiO_x$, $SiN_x$, and SiON. The organic encapsulation layer 320 may include a polymer-based material. The polymer-based material may include at least one selected from acryl-based resins, epoxy-based resins, polyimide, polyethylene, etc. In an embodiment, the organic encapsulation layer 320 may include acrylate.

Even when cracks occur in the encapsulation layer 300, the above-described multi-layer structure of the encapsulation layer 300 may prevent the cracks from connecting between the first inorganic encapsulation layer 310 and the organic encapsulation layer 320 or between the organic encapsulation layer 320 and the second inorganic encapsulation layer 330. Thus, the formation of a path through which external moisture, oxygen, etc. penetrate into the display area DA may be prevented or minimized.

Although not shown, other layers such as a capping layer and the like may be selectively disposed or provided between the first inorganic encapsulation layer 310 and the opposite electrode 230.

The color conversion panel 20 may include an upper substrate 400, a color filter layer 500, a refractive layer RL, a first capping layer CL1, a bank layer 600, a functional layer 700, and a second capping layer CL2. The upper substrate 400 may be arranged or disposed on the lower substrate 100 with a display element therebetween. The upper substrate 400 may be arranged or disposed on the first organic light-emitting diode OLED1, the second organic light-emitting diode OLED2, and the third organic light-emitting diode OLED3.

The upper substrate 400 may include a central area CA overlapping the display element. In an embodiment, the central area CA may include a first central area CA1, a second central area CA2, and a third central area CA3. The first central area CA1 may overlap the first organic light-emitting diode OLED1 and/or the first emission area EA1. The second central area CA2 may overlap the second organic light-emitting diode OLED2 and/or the second emission area EA2. The third central area CA3 may overlap the third organic light-emitting diode OLED3 and/or the third emission area EA3.

The upper substrate 400 may include glass, metal, or a polymer resin. In an embodiment where the upper substrate 400 is flexible or bendable, the upper substrate 400 may include a polymer resin such as polyethersulfone, polyacrylate, polyetherimide, polyethylene naphthalate, polyethylene terephthalate, polyphenylene sulfide, polyarylate, polyimide, polycarbonate, and cellulose acetate propionate. In an embodiment, the upper substrate 400 may have a multi-layer structure that includes two layers each including a polymer resin and a barrier layer therebetween, where the barrier layer includes an inorganic material such as silicon oxide ($SiO_x$), silicon nitride ($SiN_x$), or silicon oxynitride (SiON).

The color filter layer 500 may be arranged or disposed on a lower surface of the upper substrate 400 in a direction toward the lower substrate 100 from the upper substrate 400. The color filter layer 500 may include a first color filter 510, a second color filter 520, and a third color filter 530. The first color filter 510 may be arranged in the first central area CA1. The second color filter 520 may be arranged in the second central area CA2. The third color filter 530 may be arranged in the third central area CA3. Each of the first color filter 510, the second color filter 520, and the third color filter 530 may include a photosensitive resin material. Each of the first color filter 510, the second color filter 520, and the third color filter 530 may include a dye representing a unique color. The first color filter 510 may only allow light having a wavelength of about 630 nm to about 780 nm to pass therethrough, the second color filter 520 may only allow light having a wavelength of about 495 nm to about 570 nm to pass therethrough, and the third color filter 530 may only allow light having a wavelength of about 450 nm to about 495 nm to pass therethrough.

The color filter layer 500 may reduce external light reflection of the display device 1. In one embodiment, for example, when external light reaches the first color filter 510, only light of preset wavelengths as described above may pass through the first color filter 510, and light of other wavelengths may be absorbed by the first color filter 510. Accordingly, only light of the preset wavelengths from among external light incident onto the display device 1 may pass through the first color filter 510, and part of the passed-through light may be reflected on the opposite electrode 230 and/or the first pixel electrode 210R thereunder, and emitted back to the outside. Because only part of external light incident onto a place where the first pixel PX1 is located is reflected to the outside, the reflection of external light may be reduced. The above features may also be applicable to the second color filter 520 and the third color filter 530.

The first color filter 510, the second color filter 520, and the third color filter 530 may overlap one another. The first color filter 510, the second color filter 520, and the third color filter 530 may overlap each other between one of the central area CA and another one of the central area CA. In one embodiment, for example, the first color filter 510, the second color filter 520, and the third color filter 530 may overlap each other between the first central area CA1 and the second central area CA2. In such an embodiment, the third color filter 530 may be arranged between the first central area CA1 and the second central area CA2. The first color filter 510 may extend from the first central area CA1 and may overlap the third color filter 530. The second color filter 520 may extend from the second central area CA2 and may overlap the third color filter 530.

The first color filter 510, the second color filter 520, and the third color filter 530 may overlap each other between the second central area CA2 and the third central area CA3. The first color filter 510 may be arranged between the second central area CA2 and the third central area CA3. The second color filter 520 may extend from the second central area CA2 and may overlap the first color filter 510. The third color filter 530 may extend from the third central area CA3 and may overlap the first color filter 510.

The first color filter 510, the second color filter 520, and the third color filter 530 may overlap each other between the third central area CA3 and the first central area CA1. The second color filter 520 may be arranged between the third central area CA3 and the first central area CA1. The third color filter 530 may extend from the third central area CA3 and may overlap the second color filter 520. The first color filter 510 may extend from the first central area CA1 and may overlap the second color filter 520.

In such an embodiment, as described above, the first color filter 510, the second color filter 520, and the third color filter 530 may overlap each other to define a light-shielding portion BP. Thus, the color filter layer 500 may prevent or reduce color mixing without a separate light-shielding element.

In an embodiment, the third color filter 530 may be stacked on the upper substrate 400 substantially close to the upper substrate 400 or directly on the upper substrate 400. In such an embodiment, the third color filter 530 may partially absorb external light incident from the outside of the upper substrate 400, so that the reflectance of the display device 1 may be reduced and light reflected on the third color filter 530 is effectively prevented from being recognized by a user.

The refractive layer RL may be arranged in the central area CA. The refractive layer RL may be arranged in each of the first central area CA1, the second central area CA2, and the third central area CA3. The refractive layer RL may include an organic material. In an embodiment, a refractive index of the refractive layer RL may be less than a refractive index of the first capping layer CL1. In an embodiment, the refractive index of refractive layer RL may be less than a refractive index of the color filter layer 500. Thus, the refractive layer RL may concentrate light.

The first capping layer CL1 may be arranged or disposed on the refractive layer RL and the color filter layer 500. In an embodiment, the first capping layer CL1 may be arranged between the color filter layer 500 and the functional layer 700. The first capping layer CL1 may protect the refractive layer RL and the color filter layer 500. The first capping layer CL1 may prevent or reduce impurities such as moisture and/or air from permeating from the outside and damaging or contaminating the refractive layer RL and/or the color filter layer 500. The first capping layer CL1 may include an inorganic material.

The bank layer 600 may be arranged or disposed on the first capping layer CL1. The bank layer 600 may include an organic material. In an embodiment, the bank layer 600 may include a light-shielding material to function as a light-shielding layer. In one embodiment, for example, the light-shielding material may include at least one selected from a black pigment, a black dye, a black particle, and a metal particle.

A plurality of openings may be defined in the bank layer 600. In one embodiment, for example, a central opening COP may be defined in the bank layer 600. The central opening COP may overlap the central area CA. In an embodiment, a plurality of central openings COP may overlap the central area CA. In one embodiment, for example, a first central opening COP1 may overlap the first central area CA1. In such an embodiment, a second central opening COP2 may overlap the second central area CA2, and a third central opening COP3 may overlap the third central area CA3.

The functional layer 700 may fill the central opening COP. In an embodiment, the functional layer 700 may include at least one selected from a quantum dot and a scatterer. In an embodiment, the functional layer 700 may include a first quantum dot layer 710, a second quantum dot layer 720, and a transmission layer 730.

The first quantum dot layer 710 may overlap the first central area CA1. The first quantum dot layer 710 may fill the first central opening COP1. The first quantum dot layer 710 may overlap the first emission area EA1. The first pixel PX1 may include the first organic light-emitting diode OLED1 and the first quantum dot layer 710.

The first quantum dot layer 710 may convert light of a first wavelength band generated in the emission layer 220 on the first pixel electrode 210R into light of a second wavelength band. In one embodiment, for example, when light having a wavelength of about 450 nm to about 495 nm is generated in the emission layer 220 on the first pixel electrode 210R, the first quantum dot layer 710 may convert that light into light having a wavelength of about 630 nm to about 780 nm. Thus, in the first pixel PX1, the light having a wavelength of about 630 nm to about 780 nm may be emitted to the outside through the upper substrate 400. In an embodiment, the first quantum dot layer 710 may include a first quantum dot QD1, a first scatterer SC1, and a first base resin BR1. In such an embodiment, the first base resin BR1 may fill the first central opening COP1, and the first quantum dot QD1 and the first scatterer SC1 may be dispersed in the first base resin BR1.

The second quantum dot layer 720 may overlap the second central area CA2. The second quantum dot layer 720 may fill the second central opening COP2. The second quantum dot layer 720 may overlap the second emission area EA2. The second pixel PX2 may include the second organic light-emitting diode OLED2 and the second quantum dot layer 720.

The second quantum dot layer 720 may convert light of the first wavelength band generated in the emission layer 220 on the second pixel electrode 210G into light of a third wavelength band. In one embodiment, for example, when light having a wavelength of about 450 nm to about 495 nm is generated in the emission layer 220 on the second pixel electrode 210G, the second quantum dot layer 720 may convert that light into light having a wavelength of about 495 nm to about 570 nm. Accordingly, in the second pixel PX2, the light having a wavelength of about 495 nm to about 570 nm may be emitted to the outside through the upper substrate 400. In an embodiment, the second quantum dot layer 720 may include a second quantum dot QD2, a second scatterer SC2, and a second base resin BR2. In such an embodiment, the second base resin BR2 may fill the second central opening COP2, and the second quantum dot QD2 and the second scatterer SC2 may be dispersed in the second base resin BR2.

The transmission layer 730 may overlap the third central area CA3. The transmission layer 730 may fill the third central opening COP3. The transmission layer 730 may overlap the third emission area EA3. The third pixel PX3 may include the third organic light-emitting diode OLED3 and the transmission layer 730.

The transmission layer 730 may emit light generated in the emission layer 220 on the third pixel electrode 210B to the outside without wavelength conversion. In one embodiment, for example, when light having a wavelength of about 450 nm to about 495 nm is generated in the emission layer 220 on the third pixel electrode 210B, the transmission layer 730 may emit that light to the outside without wavelength conversion. In an embodiment, the transmission layer 730 may include a third scatterer SC3 and a third base resin BR3. In such an embodiment, the third base resin BR3 may fill the third central opening COP3, and the third scatterer SC3 may be dispersed in the third base resin BR3. In an embodiment, the transmission layer 730 may not include a quantum dot.

At least one selected from the first quantum dot QD1 and the second quantum dot QD2 may include a semiconductor material such as cadmium sulfide (CdS), cadmium telluride (CdTe), zinc sulfide (ZnS), or indium phosphide (InP). A size of the quantum dot may be several nanometers, and a wavelength of light after conversion may vary depending on the size of the quantum dot.

In an embodiment, a core of the quantum dot may include at least one selected from among a Group II-VI compound, a Group III-V compound, a Group IV-VI compound, a Group IV element, a Group IV compound, and a combination thereof.

The Group II-VI compound may be selected from: a binary compound selected from CdSe, CdTe, ZnS, ZnSe, ZnTe, ZnO, HgS, HgSe, HgTe, MgSe, MgS, and a combination thereof; a ternary compound selected from AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; and a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

The Group III-V compound may be selected from: a binary compound selected from GaN, GaP, GaAs, GaSb, AlN, AlP, AlAs, AlSb, InN, InP, InAs, InSb, and a combination thereof; a ternary compound selected from GaNP, GaNAs, GaNSb, GaPAs, GaPSb, AlNP, AlNAs, AlNSb, AlPAs, AlPSb, InGaP, InNP, InNAs, InNSb, InPAs, InPSb, and a combination thereof; and a quaternary compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof.

The Group IV-VI compound may be selected from: a binary compound selected from SnS, SnSe, SnTe, PbS, PbSe, PbTe, and a combination thereof; a ternary compound selected from the group consisting of SnSeS, SnSeTe, SnSTe, PbSeS, PbSeTe, PbSTe, SnPbS, SnPbSe, SnPbTe, and a combination thereof; and a quaternary compound selected from SnPbSSe, SnPbSeTe, SnPbSTe, and a combination thereof. The Group IV element may be selected from Si, Ge, and a combination thereof. The Group IV compound may be a binary compound selected from SiC, SiGe, and a combination thereof.

In such an embodiment, a binary compound, a ternary compound, or a quaternary compound may be present in a particle at a uniform concentration, or may be partially divided into states with different concentration distributions in a same particle. In such an embodiment, the quantum dot may have a core/shell structure in which one quantum dot surrounds another quantum dot. An interface between the core and the shell may have a concentration gradient in which a concentration of an element in the shell decreases toward the center of the quantum dot.

In an embodiment, the quantum dot may have a core-shell structure a core and a shell surrounding the core, wherein the shell includes the aforementioned nanocrystal. The shell of the quantum dot may serve as a protective layer to maintain semiconductor properties by preventing chemical denaturalization of the core and/or may serve as a charging layer to impart electrophoretic properties to the quantum dot. The shell may be a single layer or multiple layers. In one embodiment, for example, the shell of the quantum dot may include a metal or non-metal oxide, a semiconductor compound, or a combination thereof.

In one embodiment, for example, the metal or non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and the like, or a ternary compound such as $MgAl_2O_4$, $CoFe_2O_4$, $NiFe_2O_4$, $CoMn_2O_4$, and the like. However, the disclosure is not limited thereto.

In an embodiment, the semiconductor compound may include, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the disclosure is not limited thereto.

The quantum dot may have a full width of half maximum ("FWHM") of an emission wavelength spectrum of about 45 nm or less, for example, about 40 nm or less, and for example, about 30 nm or less, and the color purity or color reproducibility thereof may be improved in this range. In addition, light emitted through such a quantum dot is emitted in all directions, and thus, an optical viewing angle thereof may be improved.

In an embodiment, the quantum dot may be in a shape that is commonly used in the art, and is not limited thereto. In one embodiment, for example, the quantum may be spherical, pyramidal, multi-arm, or cubic nanoparticles, nanotubes, nanowires, nanofibers, nanoplatelets, etc.

The quantum dot may determine a color of emitted light based on a particle size, and may accordingly have various emission colors, such as blue, red, and green.

The first scatterer SC1, the second scatterer SC2, and the third scatterer SC3 may scatter light so that more light may be emitted. The first scatterer SC1, the second scatterer SC2, and the third scatterer SC3 may improve emission efficiency. At least one selected from the first scatterer SC1, the second scatterer SC2, and the third scatterer SC3 may include at least one material selected from a metal and a metal oxide to evenly scatter light. In one embodiment, for example, at least one selected from the first scatterer SC1, the second scatterer SC2, and the third scatterer SC3 may include at least one selected from $TiO_2$, $ZrO_2$, $Al_2O_3$, $In_2O_3$, ZnO, $SnO_2$, $Sb_2O_3$, and ITO. In an embodiment, at least one selected from the first scatterer SC1, the second scatterer SC2, and the third scatterer SC3 may have a refractive index of 1.5 or more. Accordingly, the emission efficiency of the functional layer 700 may be improved. In an embodiment, at least one selected from the first scatterer SC1, the second scatterer SC2, and the third scatterer SC3 may be omitted.

Each of the first base resin BR1, the second base resin BR2, and the third base resin BR3 may include a light-transmitting material. In one embodiment, for example, at least one of the first base resin BR1, the second base resin BR2, and the third base resin BR3 may include a polymer resin such as acryl, BCB, or HMDSO.

The second capping layer CL2 may be arranged or disposed on the bank layer 600 and the functional layer 700. The second capping layer CL2 may protect the bank layer 600 and the functional layer 700. The second capping layer CL2 may prevent or reduce impurities such as moisture and/or air from permeating from the outside and damaging or contaminating the bank layer 600 and/or the functional layer 700. The second capping layer CL2 may include an inorganic material.

In an embodiment, a spacer (not shown) may be further arranged or disposed on the second capping layer CL2. The spacer may maintain a gap between the display panel 10 and the color conversion panel 20.

A filler 800 may be arranged between the display panel 10 and the color conversion panel 20. The filler 800 may buffer an external pressure, etc. The filler 800 may include an organic material such as methyl silicone, phenyl silicone, or polyimide. However, the disclosure is not limited thereto, and the filler 800 may include at least one selected from a urethane-based resin, an epoxy-based resin, and an acryl-based resin, which are organic sealants, or may include silicone that is an inorganic sealant.

In an embodiment of the display device 1 as described above, light of the second wavelength band may be emitted from the first pixel PX1 to the outside, light of the third wavelength band may be emitted from the second pixel PX2 to the outside, and light of the first wavelength band may be emitted from the third pixel PX3 to the outside. In such an embodiment, the display device 1 may display a full color image.

Figure 4:
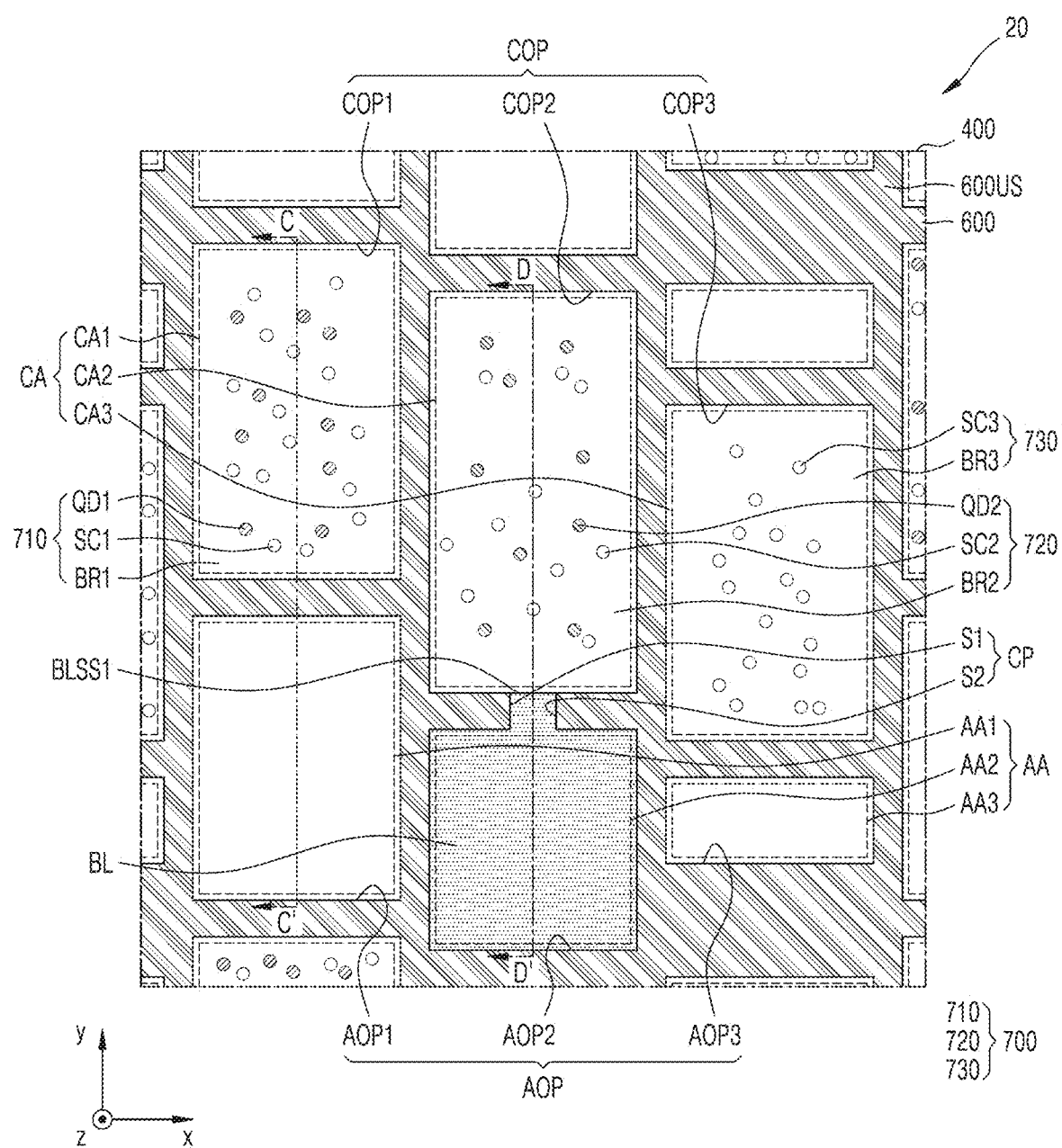
FIG. 4 is a plan view schematically illustrating a color conversion panel according to an embodiment.

FIG. 4 is a plan view schematically illustrating a color conversion panel 20 according to an embodiment. FIG. 4 is an enlarged view of a portion of region B of the display device 1 in FIG. 1 corresponding to the color conversion panel 20. In FIG. 4, the same or like reference characters as those of FIG. 3 denote the same or like elements, and any repetitive detailed descriptions thereof will be omitted.

Referring to FIG. 4, an embodiment of the color conversion panel 20 may include the upper substrate 400, the bank layer 600, a blocking layer BL, and the functional layer 700.

The upper substrate 400 may include a central area CA and an adjacent area AA. In an embodiment, the central area CA may include a first central area CA1, a second central area CA2, and a third central area CA3. In an embodiment, the central area CA may include a plurality of first central areas CA1, a plurality of second central areas CA2, and a plurality of third central areas CA3.

The first central area CA1, the second central area CA2, and the third central area CA3 may be spaced apart from each other. In an embodiment, the first central area CA1, the second central area CA2, and the third central area CA3 may be alternately arranged in a first direction (e.g., an x direction or a −x direction). In an embodiment, the first central area CA1 may overlap the first emission area EA1 (see FIG. 3). The second central area CA2 may overlap the second emission area EA2 (see FIG. 3). The third central area CA3 may overlap the third emission area EA3 (see FIG. 3).

The adjacent area AA may be adjacent to the central area CA. The adjacent area AA may include a first adjacent area AA1, a second adjacent area AA2, and a third adjacent area AA3. The adjacent area AA may be arranged between two adjacent central areas CA. The adjacent area AA may overlap a non-emission area between two adjacent emission areas.

The first adjacent area AA1 may be adjacent to the first central area CA1. The first adjacent area AA1 may be arranged parallel to the first central area CA1 in a second direction (e.g., a y direction or a −y direction). The second adjacent area AA2 may be adjacent to the second central area CA2. The second adjacent area AA2 may be arranged parallel to the second central area CA2 in the second direction (e.g., the y direction or the −y direction). The third adjacent area AA3 may be adjacent to the third central area CA3. The third adjacent area AA3 may be arranged parallel to the third central area CA3 in the second direction (e.g., the y direction or the −y direction).

The first adjacent area AA1, the second adjacent area AA2, and the third adjacent area AA3 may be alternately arranged in the first direction (e.g., the x direction or the −x direction). In an embodiment, one of the first adjacent area AA1, the second adjacent area AA2 and the third adjacent area AA3 may be different in size from another one of the first adjacent area AA1, the second adjacent area AA2 and the third adjacent area AA3. In an embodiment, the third adjacent area AA3 may be smaller in size than the first adjacent area AA1 and/or the second adjacent area AA2.

The bank layer 600 may be arranged or disposed on the upper substrate 400. The central opening COP and an adjacent opening AOP may be defined in the bank layer 600. The central opening COP may be an opening in which the functional layer 700 is filled. The central opening COP may include the first central opening COP1, the second central opening COP2, and the third central opening COP3. In an embodiment, a plurality of central openings COP may be provided. The plurality of central openings COP may include a plurality of first central openings COP1, a plurality of second central openings COP2, and a plurality of third central openings COP3.

The central opening COP may overlap the central area CA. In an embodiment, the first central opening COP1 may overlap the first central area CA1. In such an embodiment, the second central opening COP2 may overlap the second central area CA2, and the third central opening COP3 may overlap the third central area CA3. In an embodiment, the first central opening COP1 may overlap the first emission area EA1 (see FIG. 3). In such an embodiment, the second central opening COP2 may overlap the second emission area EA2 (see FIG. 3), and the third central opening COP3 may overlap the third emission area EA3 (see FIG. 3).

The adjacent opening AOP may be adjacent to the central opening COP. A plurality of adjacent openings AOP may be provided. The adjacent opening AOP may be arranged between two adjacent central openings COP. The adjacent opening AOP may overlap a non-emission area between two adjacent emission areas.

In an embodiment, the adjacent opening AOP may include a first adjacent opening AOP1, a second adjacent opening AOP2, and a third adjacent opening AOP3. The plurality of adjacent openings AOP may include a plurality of first adjacent openings AOP1, a plurality of second adjacent openings AOP2, and a plurality of third adjacent openings AOP3.

The first adjacent opening AOP1 may overlap the first adjacent area AA1. The first adjacent opening AOP1 may be adjacent to the first central opening COP1. The first adjacent opening AOP1 and the first central opening COP1 may be arranged side by side in the second direction (e.g., the y direction or the −y direction). The first adjacent opening AOP1 and the first central opening COP1 may be alternately arranged in the second direction (e.g., the y direction or the −y direction).

The second adjacent opening AOP2 may overlap the second adjacent area AA2. The second adjacent opening AOP2 may be adjacent to the second central opening COP2. The second adjacent opening AOP2 and the second central opening COP2 may be arranged side by side in the second direction (e.g., the y direction or the −y direction). The second adjacent opening AOP2 and the second central opening COP2 may be alternately arranged in the second direction (e.g., the y direction or the −y direction).

The third adjacent opening AOP3 may overlap the third adjacent area AA3. The third adjacent opening AOP3 may be adjacent to the third central opening COP3. The third adjacent opening AOP3 and the third central opening COP3 may be arranged side by side in the second direction (e.g., the y direction or the −y direction). The second adjacent opening AOP2 and the second central opening COP2 may be alternately arranged in the second direction (e.g., the y direction or the −y direction).

In an embodiment, as described above, the central opening COP and the adjacent opening AOP may be defined in the bank layer 600, and the functional layer 700 may be arranged in the central opening COP of the bank layer 600. The functional layer 700 may not be filled in the adjacent opening AOP. The adjacent opening AOP may be a structure for improving the reliability of the display device. In one embodiment, for example, the functional layer 700 may be formed by an inkjet printing process. In a case of forming the functional layer 700 by discharging an ink through the central opening COP, alignment between an inkjet discharge port (not shown) and the central opening COP may be desired to be accurate. When the inkjet discharge port and the central opening COP are not accurately aligned, the functional layer 700 may be formed on an upper surface 600US of the bank layer 600. In this case, when the color conversion panel 20 and the display panel (see FIG. 3) are bonded together, the functional layer 700 formed on the upper surface 600US of the bank layer 600 may damage the encapsulation layer 300 (see FIG. 3). In this case, due to the functional layer 700 formed on the upper surface 600US of the bank layer 600, the filler 800 (see FIG. 3) may not be uniformly arranged between the display panel 10 and the color conversion panel 20.

In an embodiment of the disclosure, the central opening COP and the adjacent opening AOP adjacent thereto are defined in the bank layer 600, and thus, the formation of the functional layer 700 on the upper surface 600US of the bank layer 600 may be prevented or reduced. In such an embodiment, even if ink is discharged onto the upper surface 600US of the bank layer 600, the ink may flow into the adjacent opening AOP. Thus, the adjacent opening AOP may prevent or reduce the damage of the encapsulation layer 300, and may induce the filler 800 to be uniformly arranged.

In an embodiment, where the central opening COP and the adjacent opening AOP are defined in the bank layer 600, a part of the bank layer 600 between the central opening COP and the adjacent opening AOP may be lost. When the part of the bank layer 600 is lost, the central opening COP and the adjacent opening AOP may be connected to each other.

In an embodiment, one of the plurality of central openings COP may be connected to adjacent one of the plurality of adjacent openings AOP. In one embodiment, for example, the first central opening COP1 and the first adjacent opening AOP1 may be separated from each other, and the third central opening COP3 and the third adjacent opening AOP3 may be separated from each other. However, in such an embodiment, the second central opening COP2 and the second adjacent opening AOP2 may be connected to each other, as shown in FIG. 4.

A connection portion CP may be formed by loss of a portion of the bank layer 600. The connection portion CP may be defined in the bank layer 600 to connect the central opening COP and the adjacent opening AOP to each other. The connection portion CP may be defined by a first surface S1 and a second surface S2 facing each other.

The connection portion CP may connect one of the plurality of central openings COP and an adjacent one of the plurality of adjacent openings AOP to each other. In one embodiment, for example, the second central opening COP2 and the second adjacent opening AOP2 may be connected to each other by the connection portion CP. In an embodiment, as shown in FIG. 4, the connection portion CP is defined between the second central opening COP2 and the second adjacent opening AOP2, but in an alternative embodiment, the connection portion CP may be defined between the first central opening COP1 and the first adjacent opening AOP1. In an embodiment, the connection portion CP may be defined between the third central opening COP3 and the third adjacent opening AOP3. Hereinafter, embodiments where the connection portion CP is defined between the second central opening COP2 and the second adjacent opening AOP2 will be described in detail.

In an embodiment, the blocking layer BL may be disposed or provided to overlap the connection portion CP. The blocking layer BL may directly contact the first surface S1 of the connection portion CP and the second surface S2 of the connection portion CP. Thus, the blocking layer BL may block a connection from the central opening COP to the adjacent opening AOP.

The blocking layer BL may include a first side surface BLSS1 facing the central opening COP. In one embodiment, for example, the first side surface BLSS1 of the blocking layer BL may face the second central opening COP2. In such an embodiment, the first side surface BLSS1 of the blocking layer BL may directly contact the second quantum dot layer 720.

In an embodiment, the blocking layer BL may extend from the connection portion CP to the adjacent opening AOP. In an embodiment, the blocking layer BL may fill the adjacent opening AOP. In one embodiment, for example, when the connection portion CP is defined between the second central opening COP2 and the second adjacent opening AOP2, the blocking layer BL may fill the second adjacent opening AOP2.

The blocking layer BL and the functional layer 700 may include a same material as each other. In an embodiment, the blocking layer BL and at least one selected from the first quantum dot layer 710, the second quantum dot layer 720, and the transmission layer 730 may include a same material as each other. In one embodiment, for example, the blocking layer BL may include at least one selected from the first quantum dot QD1, the first scatterer SC1, and the first base resin BR1. In an alternative, the blocking layer BL may include at least one selected from the second quantum dot QD2, the second scatterer SC2, and the second base resin BR2. In another alternative embodiment, the blocking layer BL may include at least one selected from the third scatterer SC3 and the third base resin BR3.

The blocking layer BL may include a polymer resin such as acryl, BCB, or HMDSO. The blocking layer BL may include at least one selected from $TiO_2$, $ZrO_2$, $Al_2O_3$, $In_2O_3$, $ZnO$, $SnO_2$, $Sb_2O_3$, and ITO. The blocking layer BL may include a solvent-free material that does not contain a solvent.

The functional layer 700 may fill the central opening COP. The functional layer 700 may fill the plurality of central openings COP. In an embodiment, the functional layer 700 may be spaced apart from the adjacent opening AOP. The functional layer 700 may be spaced apart from the plurality of adjacent openings AOP.

The functional layer 700 may include the first quantum dot layer 710, the second quantum dot layer 720, and the transmission layer 730. The first quantum dot layer 710 may fill the first central opening COP1. The first quantum dot layer 710 may include the first quantum dot QD1, the first scatterer SC1, and the first base resin BR1. The second quantum dot layer 720 may fill the second central opening COP2. The second quantum dot layer 720 may include the second quantum dot QD2, the second scatterer SC2, and the second base resin BR2. The transmission layer 730 may fill the third central opening COP3. The transmission layer 730 may include the third scatterer SC3 and the third base resin BR3.

The functional layer 700 may fill the central opening COP in which a connection to the adjacent opening AOP is blocked by the blocking layer BL. In one embodiment, for example, the second quantum dot layer 720 may fill the second central opening COP2 in which a connection to the second adjacent opening AOP2 is blocked by the blocking layer BL. In an alternative embodiment, where the connection portion CP is defined between the first central opening COP1 and the first adjacent opening AOP1, the first quantum dot layer 710 may fill the first central opening COP1 in which a connection to the first adjacent opening AOP1 is blocked by the blocking layer BL. In another alternative embodiment, where the connection portion CP is defined between the third central opening COP3 and the third adjacent opening AOP3, the transmission layer 730 may fill the third central opening COP3 in which a connection to the third adjacent opening AOP3 is blocked by the blocking layer BL.

In a case where the first central opening COP1 and the first adjacent opening AOP1 are connected to each other and the blocking layer BL is omitted, the functional layer 700 may also be formed in the adjacent opening AOP through the connection portion CP formed by the loss of the bank layer 600 when forming the second quantum dot layer 720 by an inkjet printing process. In this case, the functional layer 700 may not be formed with a preset thickness in the central opening COP, and a function of the functional layer 700, such as color conversion, may be deteriorated.

In such a case where the blocking layer BL is omitted, the second quantum dot layer 720 may not be formed with a preset thickness in the second central opening COP2. When a thickness of the second quantum dot layer 720 decreases, an amount of the second quantum dot QD2 and/or the second scatterer SC2 overlapping the second central area CA2 may decrease. Due to the decrease in thickness of the second quantum dot layer 720, an optical path of light inside the second quantum dot layer 720 may decrease, and the color conversion function of the second quantum dot layer 720 may be deteriorated. In this case, dark spots may occur in the second central area CA2. In a case where the first central opening COP1 and the first adjacent opening AOP1 are connected to each other, a thickness of the first quantum dot layer 710 may decrease, and dark spots may occur in the first central area CA1. In a case where the third central opening COP3 and the third adjacent opening AOP3 are connected to each other, a thickness of the transmission layer 730 may decrease, and a bright spot may occur in the third central area CA3.

In an embodiment of the invention, the blocking layer BL blocks connection between the central opening COP and the adjacent opening AOP, such that the functional layer 700 may be formed with a preset thickness in the central opening COP. Therefore, the blocking layer BL may maintain the function of the functional layer 700.

Figure 5:
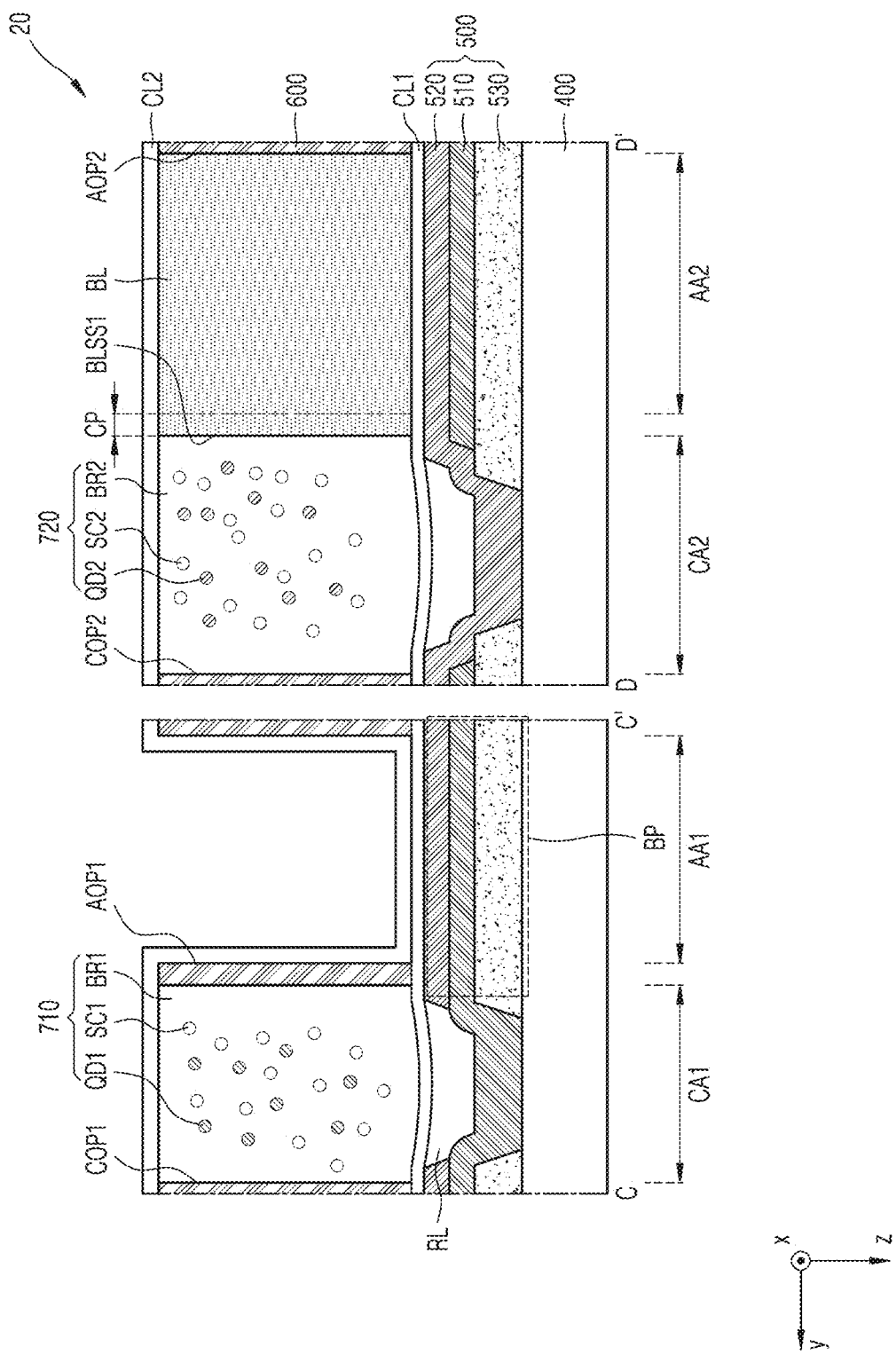
FIG. 5 is a cross-sectional view schematically illustrating a color conversion panel according to an embodiment.

FIG. 5 is a cross-sectional view schematically illustrating a color conversion panel 20 according to an embodiment. FIG. 5 is a cross-sectional view of the color conversion panel 20 in FIG. 4, taken along lines C-C' and D-D'. FIG. 5 shows the color conversion panel 20 inverted up and down. In FIG. 5, the same or like reference characters as those of FIGS. 3 and 4 denote the same or like elements, and any repetitive detailed descriptions thereof will be omitted.

Referring to FIG. 5, an embodiment of the color conversion panel 20 may include the upper substrate 400, the color filter layer 500, the refractive layer RL, the first capping layer CL1, the bank layer 600, the functional layer 700, and the second capping layer CL2.

The upper substrate 400 may include a central area and an adjacent area. The central area may include the first central area CA1 and the second central area CA2. The adjacent area may include the first adjacent area AA1 adjacent to the first central area CA1 and the second adjacent area AA2 adjacent to the second central area CA2.

The color filter layer 500 may be arranged or disposed on the upper substrate 400. The color filter layer 500 may include the first color filter 510, the second color filter 520, and the third color filter 530. The first color filter 510 may be arranged in the first central area CA1. The second color filter 520 may be arranged in the second central area CA2.

The first color filter 510, the second color filter 520, and the third color filter 530 may overlap each other. The first color filter 510, the second color filter 520, and the third color filter 530 may overlap each other in the adjacent area. The first color filter 510, the second color filter 520, and the third color filter 530 may define the light-shielding portion BP in the adjacent area. In an embodiment, the second color filter 520 and the third color filter 530 may be arranged in the first adjacent area AA1. The first color filter 510 may extend from the first central area CA1 to the first adjacent area AA1. Accordingly, the first color filter 510, the second color filter 520, and the third color filter 530 may overlap each other in the first adjacent area AA1, thereby defining the light-shielding portion BP. Thus, the color filter layer 500 may prevent or reduce color mixing in the first adjacent area AA1 without a separate light-shielding element.

In an embodiment, the first color filter 510 and the third color filter 530 may be arranged in the second adjacent area AA2. The second color filter 520 may extend from the second central area CA2 to the second adjacent area AA2. Accordingly, the first color filter 510, the second color filter 520, and the third color filter 530 may overlap each other in the second adjacent area AA2, thereby defining the light-shielding portion BP. Thus, the color filter layer 500 may prevent or reduce color mixing in the second adjacent area AA2 without a separate light-shielding element.

In an embodiment, the third color filter 530 may be disposed closely to or stacked directly on the adjacent area AA1 and/or the second adjacent area AA2 of the upper substrate 400. In such an embodiment, the third color filter 530 may partially absorb external light incident from the outside of the upper substrate 400, so that the reflectance of the display device may be reduced and light reflected on the third color filter 530 is effectively prevented from being recognized by a user.

The refractive layer RL may be arranged in each of the first central area CA1 and the second central area CA2, and the first capping layer CL1 may be arranged or disposed on the refractive layer RL and the color filter layer 500. The first capping layer CL1 may protect the refractive layer RL and the color filter layer 500.

The bank layer 600 may be arranged or disposed on the first capping layer CL1. A central opening and an adjacent opening may be defined in the bank layer 600. In one embodiment, for example, the first central opening COP1, the first adjacent opening AOP1, the second central opening COP2, and the second adjacent opening AOP2 may be defined in the bank layer 600. The first central opening COP1 may overlap the first central area CA1. The first adjacent opening AOP1 may overlap the first adjacent area AA1. The second central opening COP2 may overlap the second central area CA2. The second adjacent opening AOP2 may overlap the second adjacent area AA2.

In an embodiment, when a portion of the bank layer 600 between the second central opening COP2 and the second adjacent opening AOP2 is lost, the second central opening COP2 and the second adjacent opening AOP2 may be connected to each other. In an embodiment, the second central opening COP2 and the second adjacent opening AOP2 may be connected to each other by the connection portion CP.

In an embodiment, the blocking layer BL may be disposed to overlap or fill the connection portion CP. The blocking layer BL may block a connection from the central opening to the adjacent opening. The blocking layer BL may include the first side surface BLSS1 facing the central opening COP. In one embodiment, for example, the first side surface BLSS1 of the blocking layer BL may face the second central opening COP2. In such an embodiment, the first side surface BLSS1 of the blocking layer BL may directly contact the second quantum dot layer 720. The first side surface BLSS1 of the blocking layer BL may function as a sidewall.

In an embodiment, the blocking layer BL may extend from the connection portion CP to the adjacent opening. In an embodiment, the blocking layer BL may fill the adjacent opening. The blocking layer BL may fill the second adjacent opening AOP2.

The functional layer 700 may fill the central opening. In one embodiment, for example, the first quantum dot layer 710 may fill the first central opening COP1. The second quantum dot layer 720 may fill the second central opening COP2.

The functional layer 700 may fill the central opening in which a connection to the adjacent opening is blocked by the blocking layer BL. In one embodiment, for example, the second quantum dot layer 720 may fill the second central opening COP2 in which a connection to the second adjacent opening AOP2 is blocked by the blocking layer BL.

In a case where the blocking layer BL is omitted, the second quantum dot layer 720 may not be formed with a preset thickness in the second central opening COP2 when forming the second quantum dot layer 720 by an inkjet printing process. When a thickness of the second quantum dot layer 720 decreases, an amount of the second quantum dot QD2 and/or the second scatterer SC2 overlapping the second central area CA2 may decrease. Due to the decrease in thickness of the second quantum dot layer 720, an optical path of light inside the second quantum dot layer 720 may decrease, and the color conversion function of the second quantum dot layer 720 may be deteriorated. In this case, dark spots may occur in the second central area CA2.

In an embodiment, the blocking layer BL blocks connection to the second adjacent opening AOP2, and the second quantum dot layer 720 may fill the second central opening COP2 in which a connection to the second adjacent opening AOP2 is blocked. Accordingly, the second quantum dot layer 720 may be formed with a preset thickness in the second central opening COP2, and thus, the color conversion function of the second quantum dot layer 720 may be maintained.

In an embodiment, the adjacent opening may overlap the light-shielding portion BP. In an embodiment, the first adjacent opening AOP1 and the second adjacent opening AOP2 may overlap the light-shielding portion BP. The light-shielding portion BP may prevent or reduce the passage of light from the adjacent opening. In one embodiment, for example, even if light is color-converted or transmitted due to a material of the blocking layer BL in the second adjacent opening AOP2, the light-shielding portion BP may prevent or reduce emission of such light. In such an embodiment, the light-shielding portion BP may prevent or reduce color mixing with light passing through the second central opening COP2.

The second capping layer CL2 may be arranged or disposed on the bank layer 600, the first quantum dot layer 710, the second quantum dot layer 720, and the blocking layer BL. The second capping layer CL2 may protect the bank layer 600, the first quantum dot layer 710, the second quantum dot layer 720, and the blocking layer BL.

In an embodiment, a spacer (not shown) may be further arranged or disposed on the second capping layer CL2. The spacer may overlap the bank layer 600.

Figure 6:
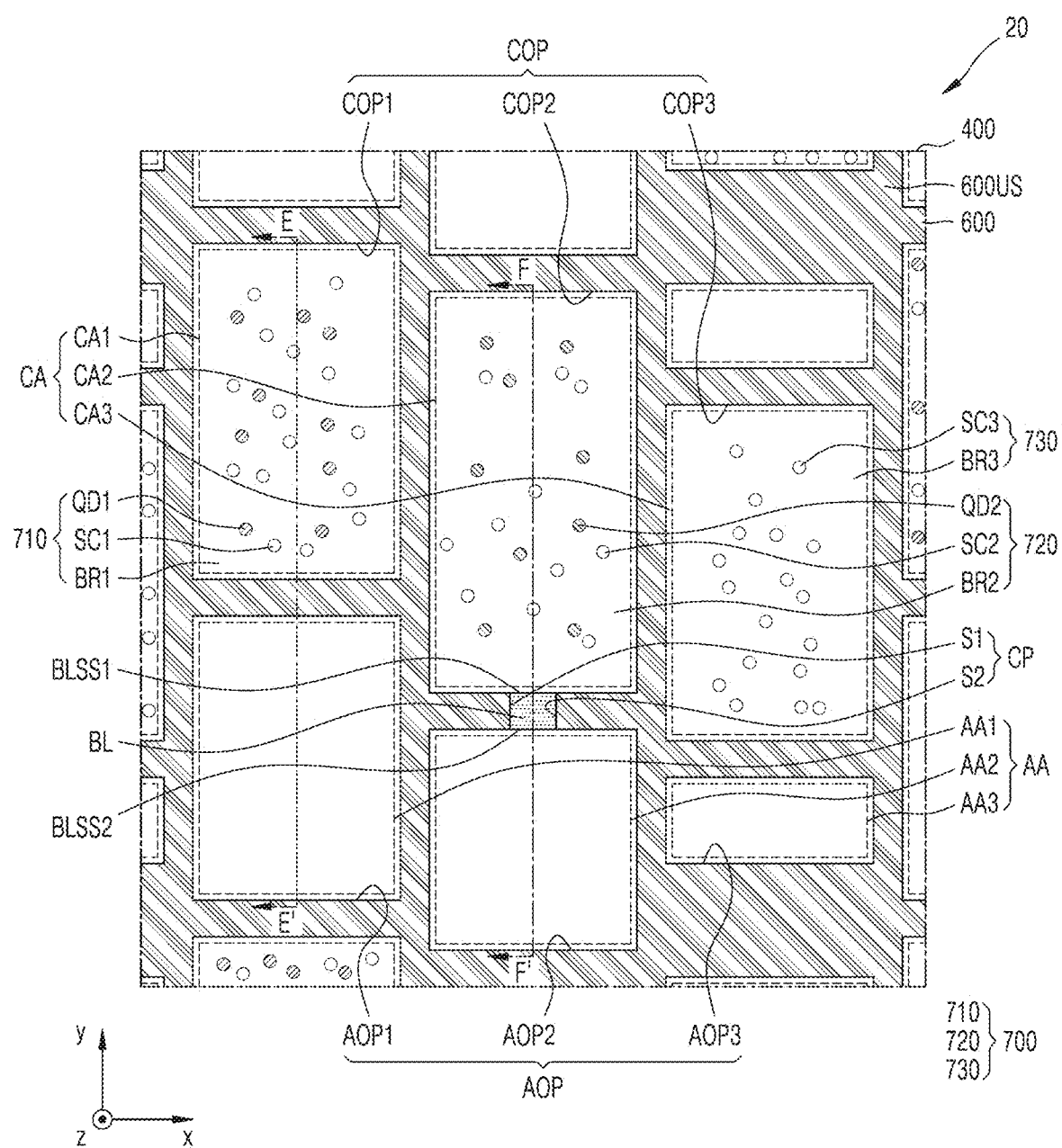
FIG. 6 is a plan view schematically illustrating a color conversion panel according to an alternative embodiment.

FIG. 6 is a plan view schematically illustrating a color conversion panel 20 according to an alternative embodiment. FIG. 6 is an enlarged view of a portion of region B of the display device 1 in FIG. 1 corresponding to the color conversion panel 20. In FIG. 6, the same or like reference characters as those of FIG. 4 denote the same or like elements, and any repetitive detailed descriptions thereof will be omitted.

Referring to FIG. 6, an embodiment of the color conversion panel 20 may include the upper substrate 400, the bank layer 600, the blocking layer BL, and the functional layer 700.

The blocking layer BL may overlap the connection portion CP. The blocking layer BL may directly contact the first surface S1 and the second surface S2 of the connection portion CP. Thus, the blocking layer BL may block a connection from the central opening COP to the adjacent opening AOP.

In an embodiment, when viewed from a direction perpendicular to the upper substrate 400, each of the central opening COP and the adjacent opening AOP may have a closed shape by the blocking layer BL. The direction perpendicular to the upper substrate 400 may be a third direction (e.g., a z direction or a −z direction). In an embodiment, in a plan view, each of the central opening COP and the adjacent opening AOP may have a closed shape by the blocking layer BL. Thus, the central opening COP and the adjacent opening AOP may be separated from each other. In one embodiment, for example, the first central opening COP1 and the first adjacent opening AOP1 may be separated from each other. The second central opening COP2 and the second adjacent opening AOP2 may be separated from each other by the blocking layer BL. The second central opening COP2 and the second adjacent opening AOP2 may not be connected to each other. In such an embodiment, the second adjacent opening AOP2 may not be filled with the blocking layer BL. Thus, the second adjacent opening AOP2 may be used as a structure for improving the reliability of the display device.

The blocking layer BL may include the first side surface BLSS1 facing the central opening COP and a second side surface BLSS2 facing the adjacent opening AOP. In one embodiment, for example, the first side surface BLSS1 of the blocking layer BL may face the second central opening COP2. In such an embodiment, the first side surface BLSS1 of the blocking layer BL may directly contact the second quantum dot layer 720. The second side surface BLSS2 of the blocking layer BL may face the second adjacent opening AOP2. The second side surface BLSS2 of the blocking layer BL may be a surface opposite to the first side surface BLSS1 of the blocking layer BL.

In an embodiment, as shown in FIG. 6, the first side surface BLSS1 of the blocking layer BL and an inner side of the bank layer 600 defining the second central opening COP2 coincide with each other, but the first side surface BLSS1 of the blocking layer BL and an inner side of the bank layer 600 defining the second central opening COP2 may not coincide with each other. In such an embodiment, as shown in FIG. 6, the second side surface BLSS2 of the blocking layer BL and an inner side of the bank layer 600 defining the second adjacent opening AOP2 coincide with each other, but not being limited thereto. Alternatively, the second side surface BLSS2 of the blocking layer BL and an inner side of the bank layer 600 defining the second adjacent opening AOP2 may not coincide with each other. In an embodiment, the blocking layer BL may partially protrude or depress in a direction toward the second central opening COP2 and/or the second adjacent opening AOP2 from the connection portion CP.

Figure 7:
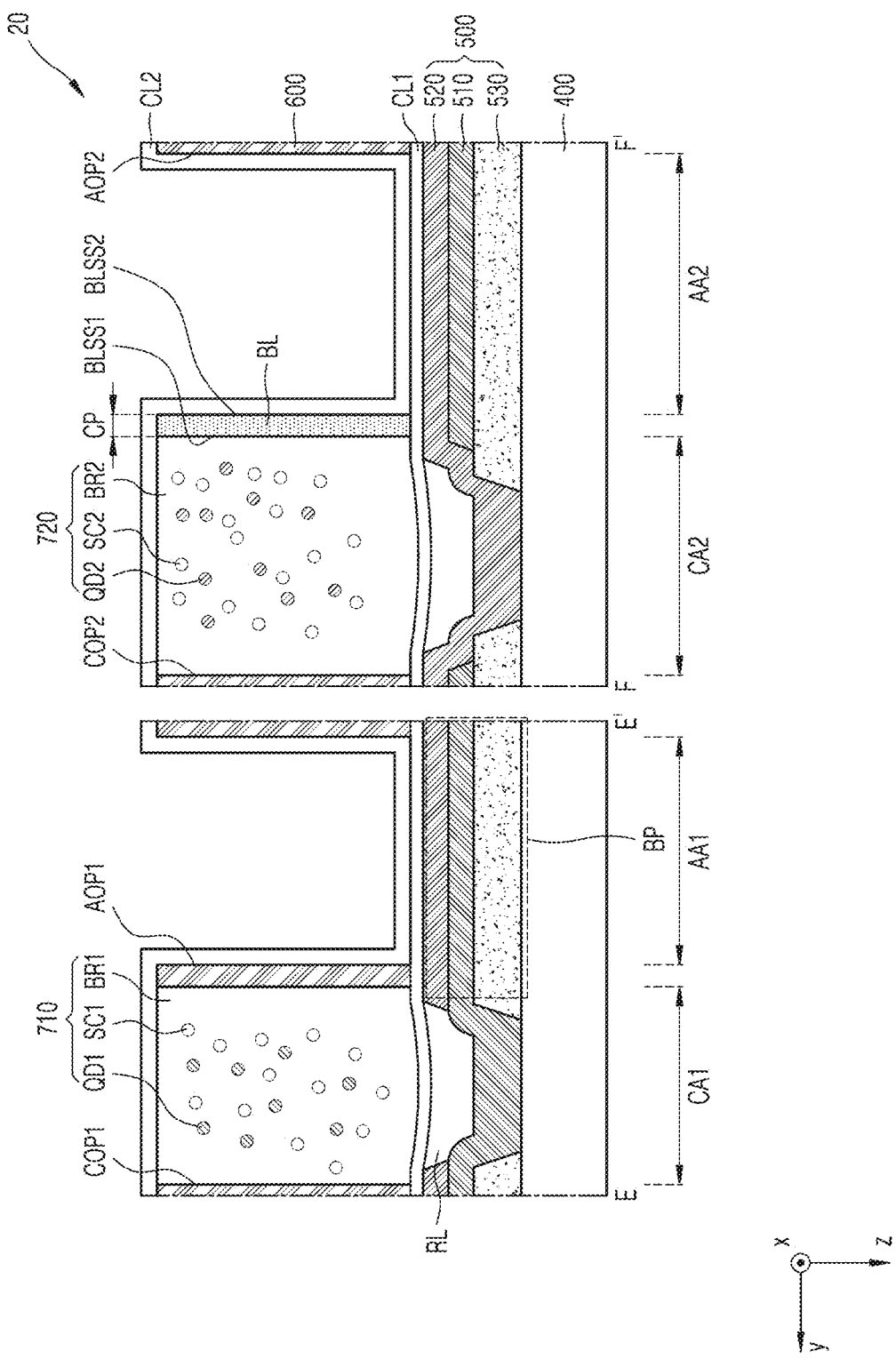
FIG. 7 is a cross-sectional view schematically illustrating a color conversion panel according to another alternative embodiment.

FIG. 7 is a cross-sectional view schematically illustrating a color conversion panel 20 according to another alternative embodiment. FIG. 7 is a cross-sectional view of the color conversion panel 20 in FIG. 6, taken along lines E-E' and F-F'. FIG. 7 shows the color conversion panel 20 inverted up and down. In FIG. 7, the same or like reference characters as those of FIG. 5 denote the same or like elements, and any repetitive detailed descriptions thereof will be omitted.

Referring to FIG. 7, an embodiment of the color conversion panel 20 may include the upper substrate 400, the color filter layer 500, the refractive layer RL, the first capping layer CL1, the bank layer 600, the functional layer 700, and the second capping layer CL2.

In an embodiment, the blocking layer BL may overlap the connection portion CP. The blocking layer BL may block a connection from a central opening to an adjacent opening. The blocking layer BL may separate the second central opening COP2 and the second adjacent opening AOP2 from each other. The blocking layer BL may overlap the connection portion CP. The blocking layer BL may not extend to the second central area CA2 and the second adjacent area AA2. Thus, the second adjacent opening AOP2 may be used as a structure for improving the reliability of the display device.

The first side surface BLSS1 of the blocking layer BL may face the second central opening COP2. In such an embodiment, the first side surface BLSS1 of the blocking layer BL may directly contact the second quantum dot layer 720, and the second side surface BLSS2 of the blocking layer BL may face the second adjacent opening AOP2. The second side surface BLSS2 of the blocking layer BL may be a surface opposite to the first side surface BLSS1 of the blocking layer BL.

Figure 8A:
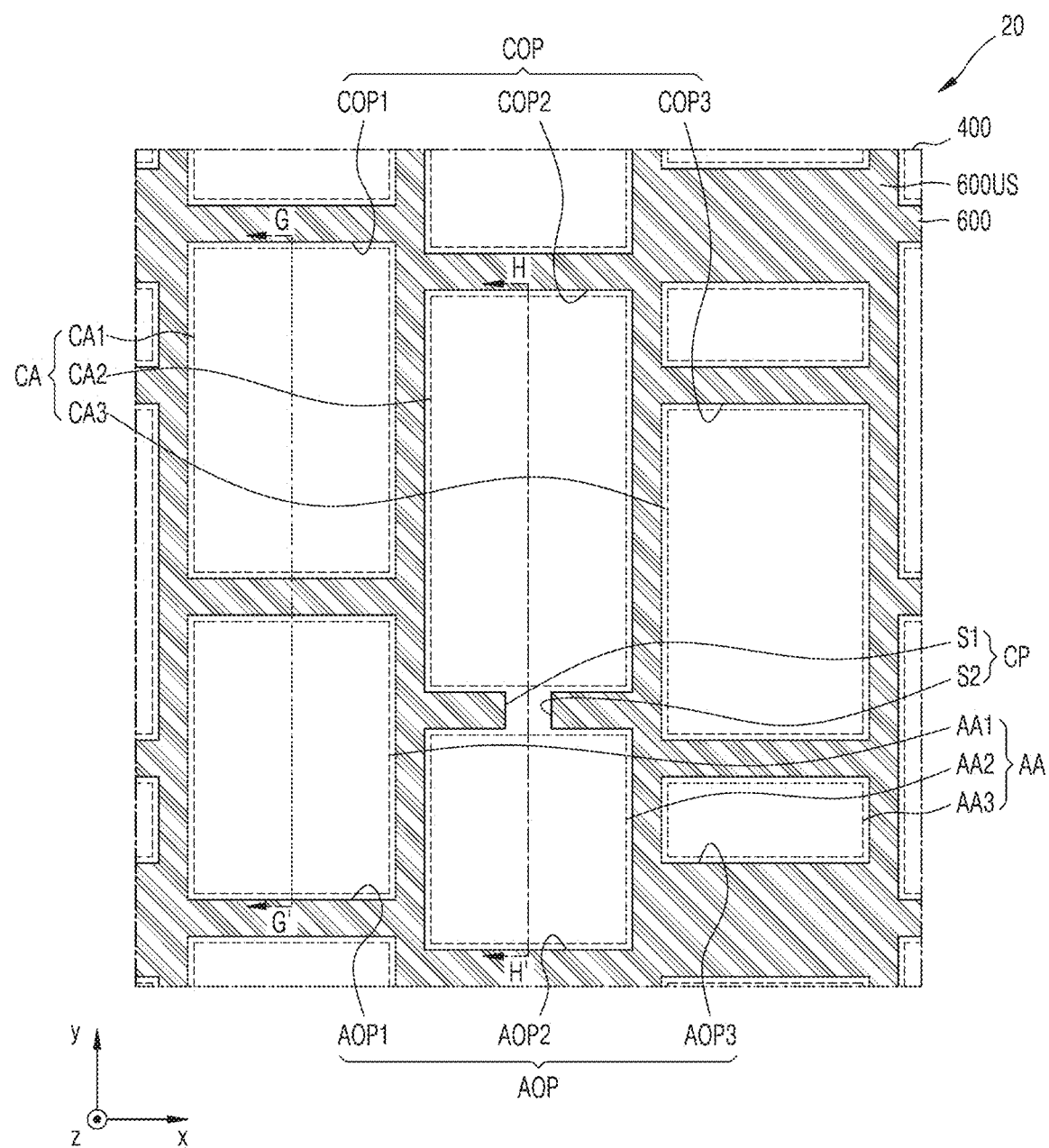
FIG. 8A is a plan view illustrating a method of repairing a display device, according to an embodiment.
Figure 8B:
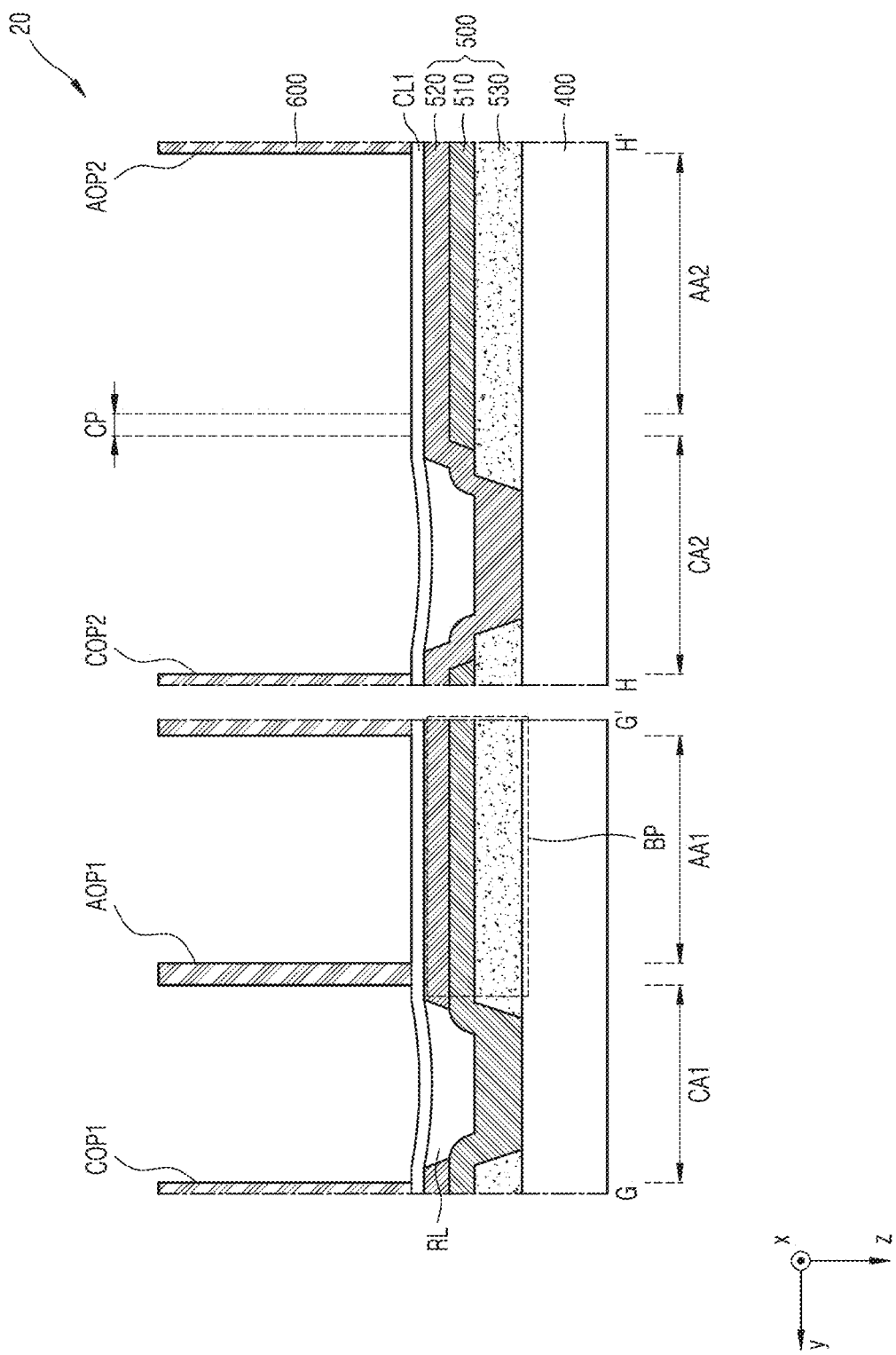
FIG. 8B is a cross-sectional view of a color conversion panel in FIG. 8A, taken along lines G-G' and H-H', according to an embodiment.
Figure 9A:
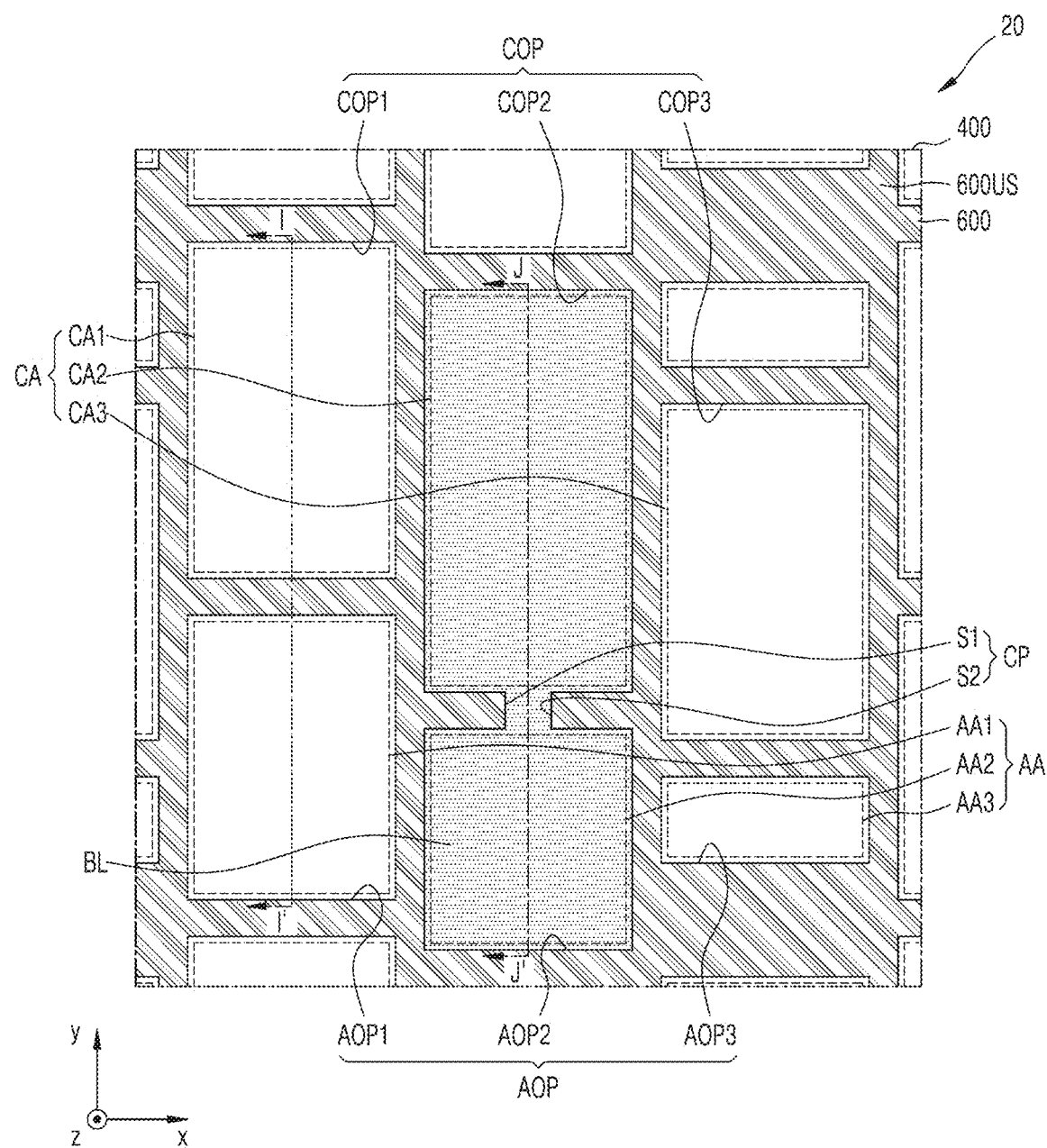
FIG. 9A is a plan view illustrating a method of repairing a display device, according to an embodiment.
Figure 9B:
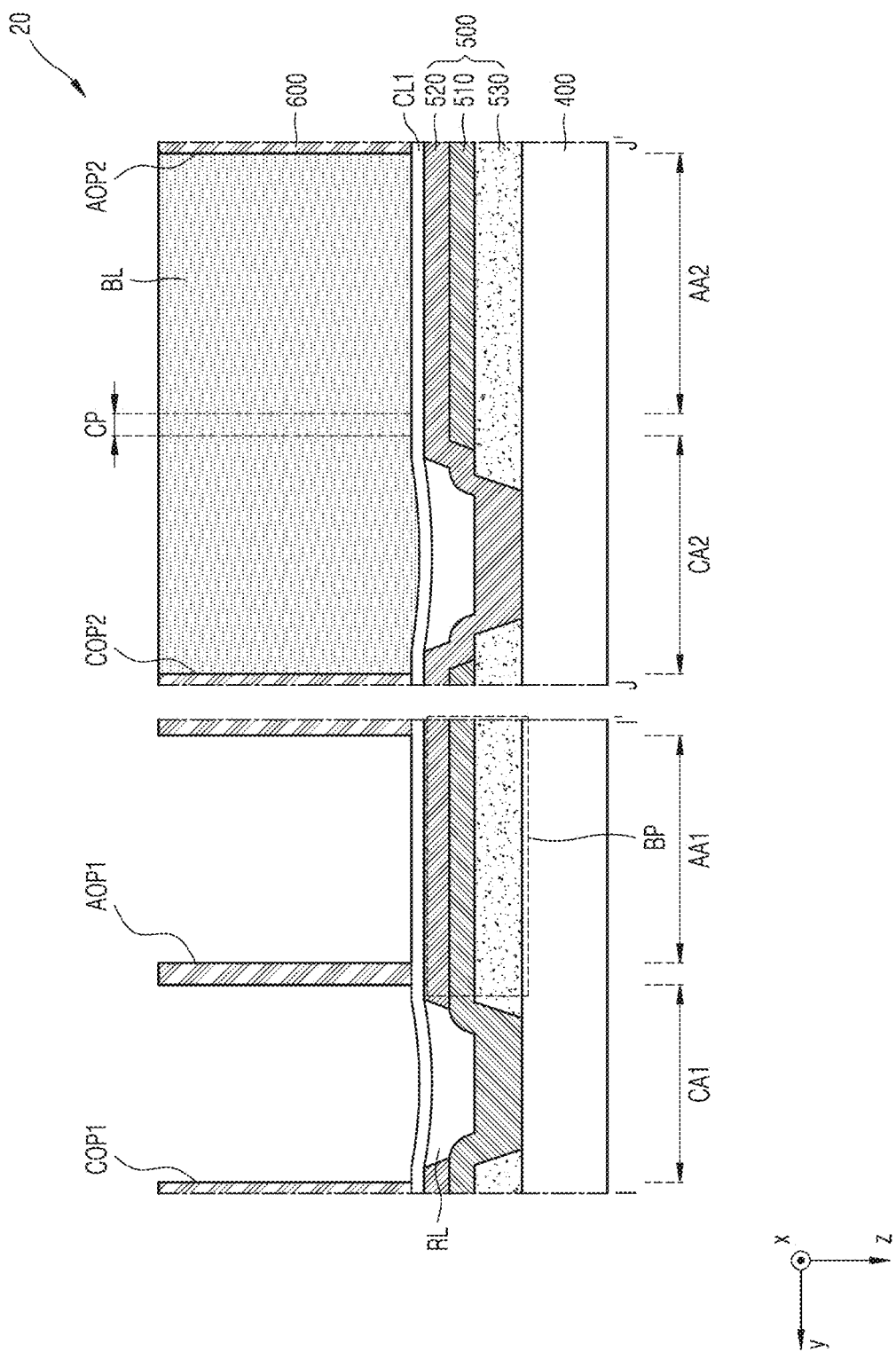
FIG. 9B is a cross-sectional view of a color conversion panel in FIG. 9A, taken along lines I-I' and J-J', according to an embodiment.
Figure 10A:
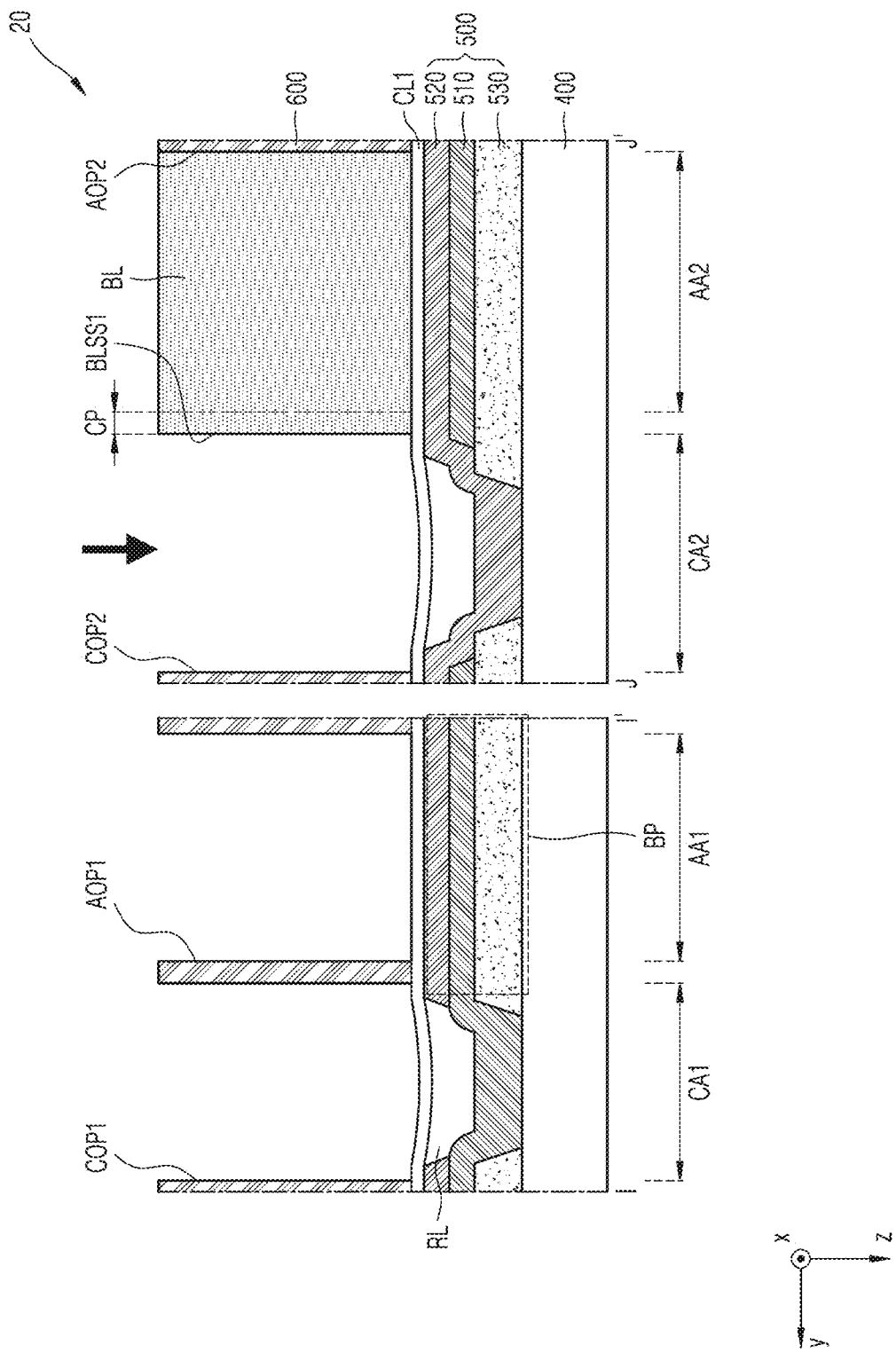
FIGS. 10A and 10B are cross-sectional views illustrating a method of repairing a display device, according to various embodiments.
Figure 10B:
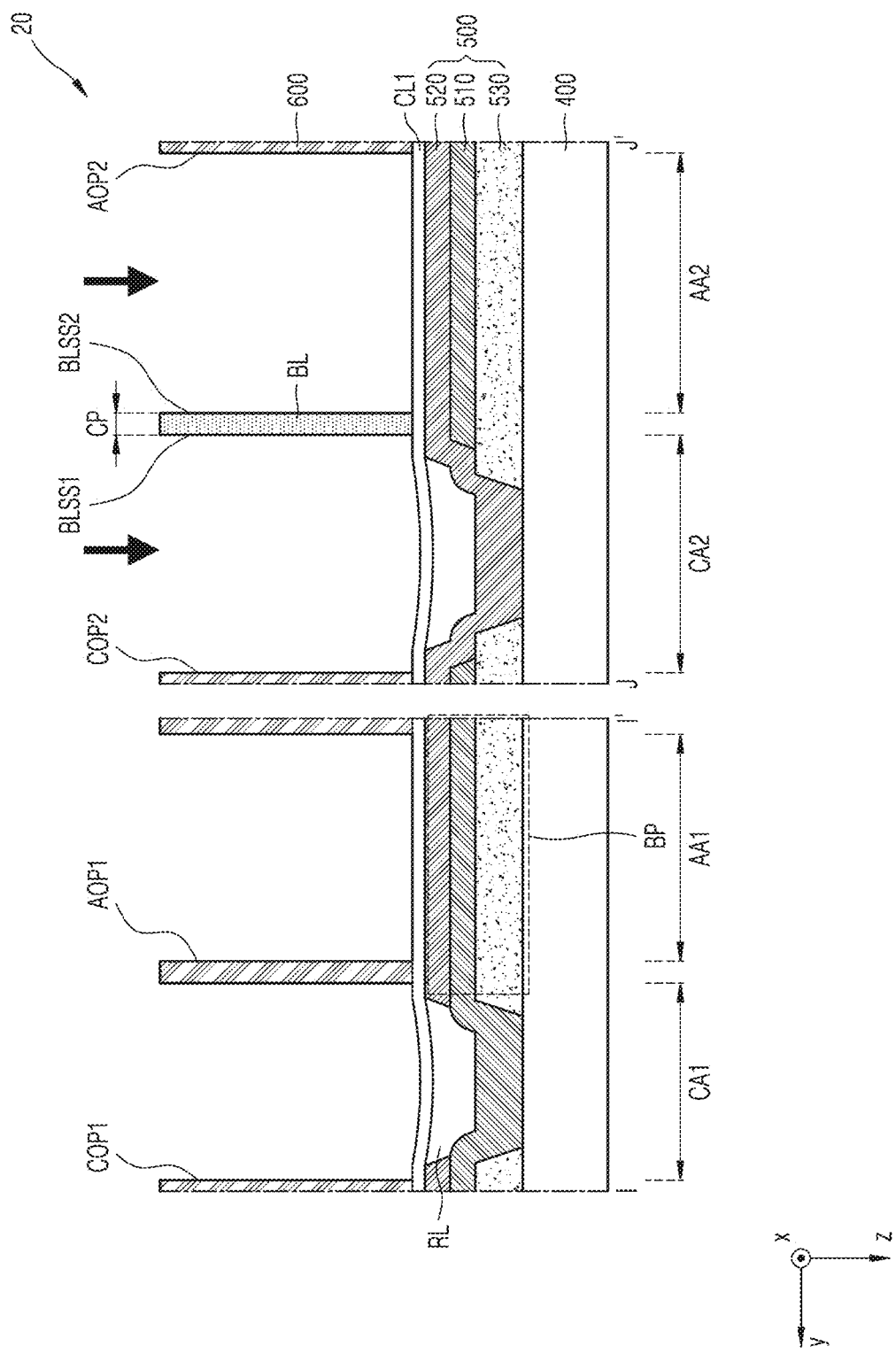
Figure 11A:
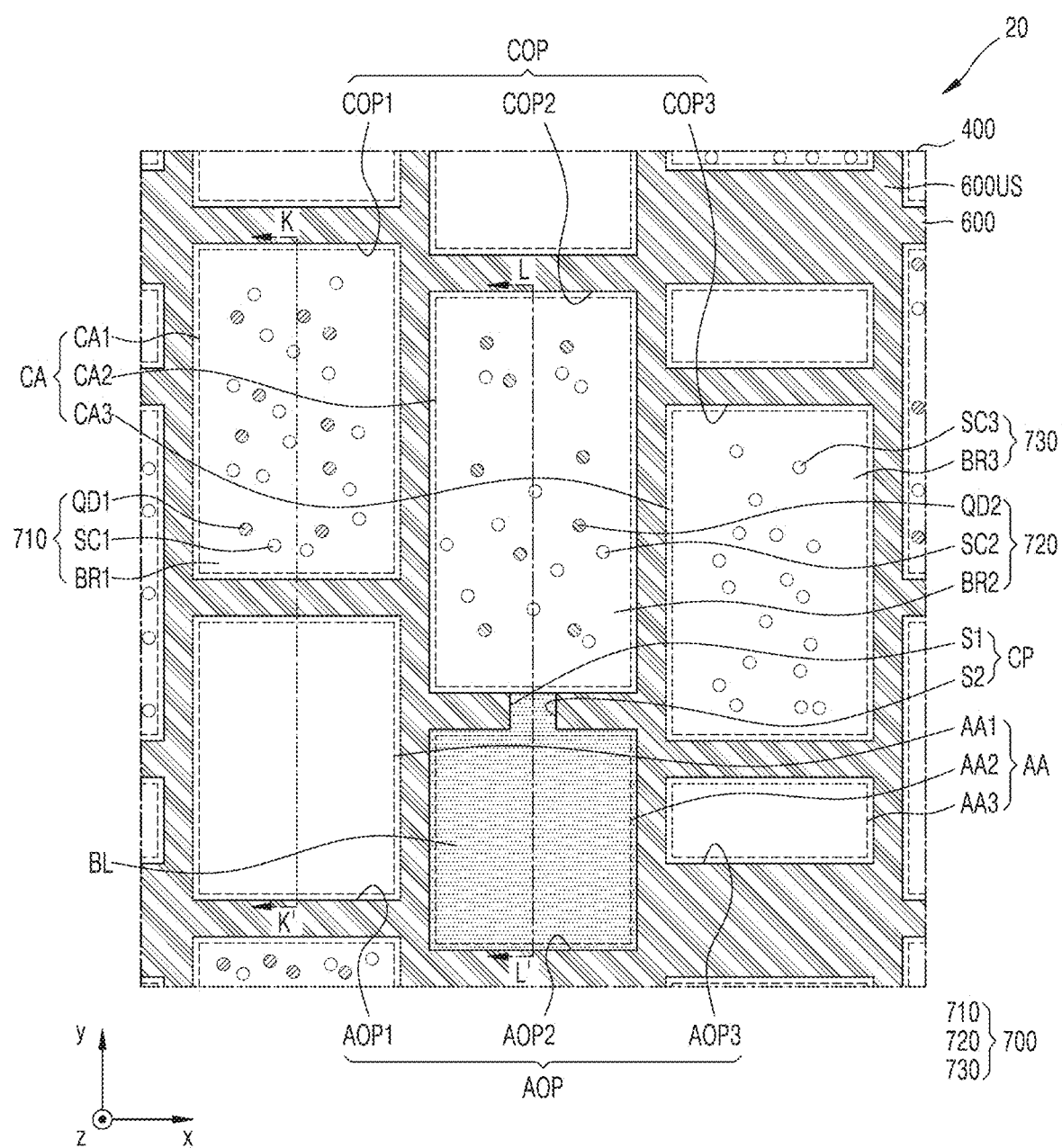
FIG. 11A is a plan view illustrating a method of repairing a display device, according to an embodiment.
Figure 11B:
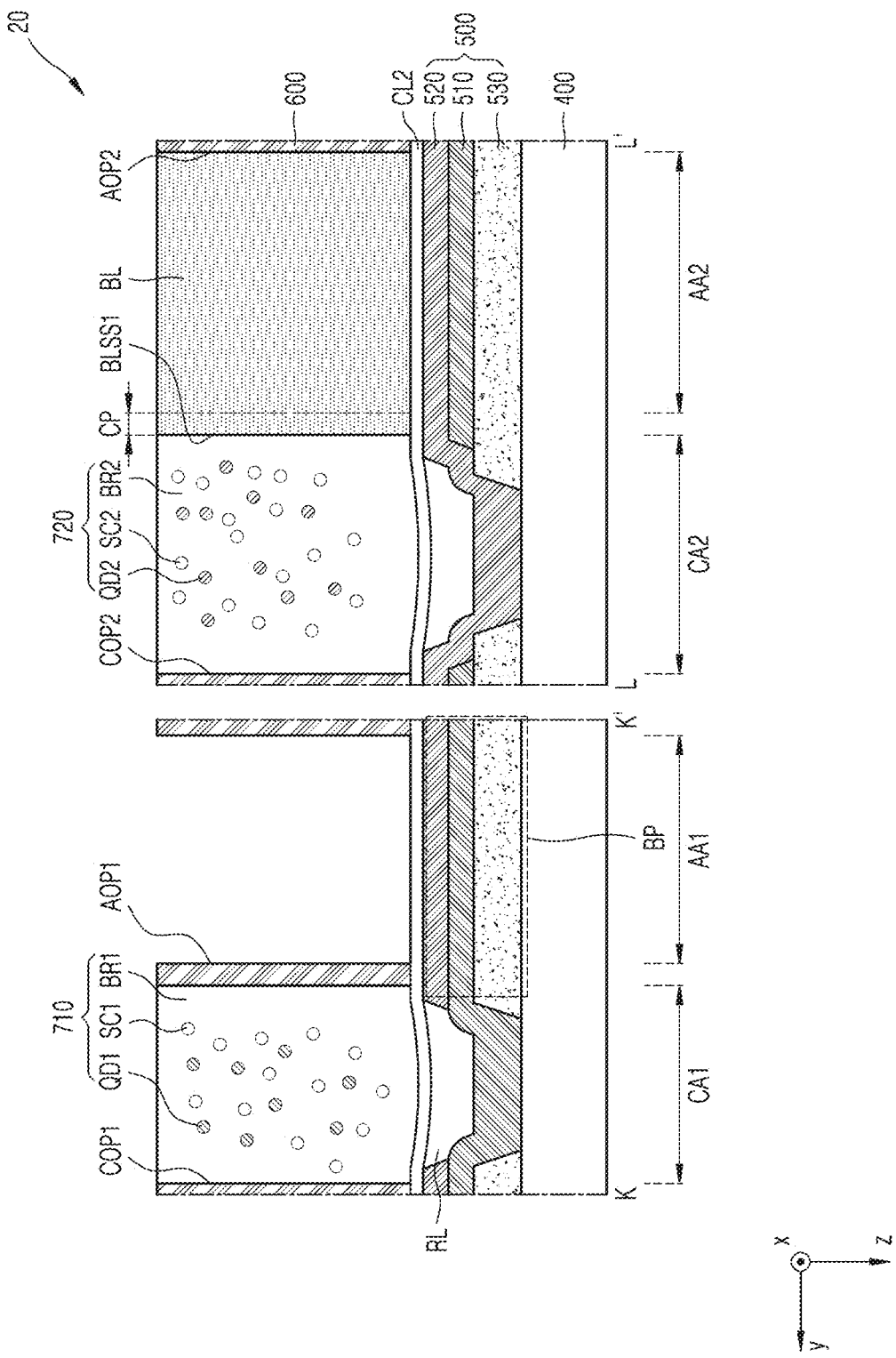
FIG. 11B is a cross-sectional view of a color conversion panel in FIG. 11A, taken along lines K-K' and L-L', according to an embodiment.

FIG. 8A is a plan view illustrating a method of repairing a display device, according to an embodiment. FIG. 8B is a cross-sectional view of the color conversion panel 20 in FIG. 8A, taken along lines G-G' and H-H'. FIG. 9A is a plan view illustrating a method of repairing a display device, according to an embodiment. FIG. 9B is a cross-sectional view of the color conversion panel 20 in FIG. 9A, taken along lines I-I' and J-J'. FIGS. 10A and 10B are cross-sectional views illustrating a method of repairing a display device, according to various embodiments. FIG. 11A is a plan view illustrating a method of repairing a display device, according to an embodiment. FIG. 11B is a cross-sectional view of the color conversion panel 20 in FIG. 11A, taken along lines K-K' and L-L'.

Each of FIGS. 8B, 9B, 10A, 10B, and 11B show the color conversion panel 20 inverted up and down. FIGS. 10A and 10B is a cross-sectional view of the color conversion panel 20 in FIG. 9A, taken along lines I-I' and J-J'.

Referring to FIGS. 8A and 8B, an embodiment of the display device may include an upper substrate 400, a color filter layer 500, a refractive layer RL, a first capping layer CL1, and a bank layer 600.

The upper substrate 400 may include a central area CA and an adjacent area AA. In an embodiment, the central area CA may include a first central area CA1, a second central area CA2, and a third central area CA3. The adjacent area AA may be adjacent to the central area CA. The adjacent area AA may include a first adjacent area AA1, a second adjacent area AA2, and a third adjacent area AA3.

The color filter layer 500 may be arranged or disposed on the upper substrate 400. The color filter layer 500 may include a first color filter 510, a second color filter 520, and a third color filter 530. The first color filter 510 may be arranged or disposed on the first central area CA1. The second color filter 520 may be arranged or disposed on the second central area CA2. The first color filter 510, the second color filter 520, and the third color filter 530 may overlap each other. The first color filter 510, the second color filter 520, and the third color filter 530 may overlap each other in the adjacent area.

The refractive layer RL may be arranged or disposed on each of the first central area CA1 and the second central area CA2, and the first capping layer CL1 may be arranged or disposed on the refractive layer RL and the color filter layer 500.

The bank layer 600 may be arranged or disposed on the first capping layer CL1. A central opening COP and an adjacent opening AOP may be defined in the bank layer 600. The central opening COP may overlap the central area CA. A plurality of central openings COP may be provided. In an embodiment, the central opening COP may include a first central opening COP1, a second central opening COP2, and a third central opening COP3. The adjacent opening AOP may be adjacent to the central opening COP. The adjacent opening AOP may overlap the adjacent area AA. A plurality of adjacent openings AOP may be provided. In an embodiment, the adjacent opening AOP may include a first adjacent opening AOP1, a second adjacent opening AOP2, and a third adjacent opening AOP3.

In an embodiment, where the central opening COP and the adjacent opening AOP are defined in the bank layer 600, a portion of the bank layer 600 defining the central opening COP and the adjacent opening AOP may be lost, such that the central opening COP and the adjacent opening AOP may be connected to each other.

In such an embodiment, one of the plurality of central openings COP may be connected to an adjacent one of the plurality of adjacent openings AOP. In one embodiment, for example, the first central opening COP1 and the first adjacent opening AOP1 may be separated from each other, and the third central opening COP3 and the third adjacent opening AOP3 may be separated from each other. However, in such an embodiment, the second central opening COP2 and the second adjacent opening AOP2 may be connected to each other, as shown in FIG. 8A.

A connection portion CP may be formed by loss of a portion of the bank layer 600. The connection portion CP may be defined in the bank layer 600 to connect the central opening COP and the adjacent opening AOP to each other. The connection portion CP may be defined by a first surface S1 and a second surface S2 facing each other.

The connection portion CP may connect one of the plurality of central openings COP and an adjacent one of the plurality of adjacent openings AOP to each other. In one embodiment, for example, the second central opening COP2 and the second adjacent opening AOP2 may be connected to each other by the connection portion CP.

In an embodiment, a location of the connection portion CP may be identified. In one embodiment, for example, the location of the connection portion CP may be identified by using a vision portion (not shown). The vision portion may include a camera, etc. The vision portion may identify that the connection portion CP is arranged between the second central opening COP2 and the second adjacent opening AOP2.

Referring to FIGS. 9A and 9B, a blocking layer BL may be formed on the connection portion CP. The blocking layer BL may be formed in the central opening COP, the adjacent opening AOP, and the connection portion CP. In an embodiment, a position of the connection portion CP is identified by the vision portion, and the blocking layer BL may be formed only in an area in which a portion of the bank layer 600 is lost. In one embodiment, for example, the blocking layer BL may be formed in the second central opening COP2, the second adjacent opening AOP2, and the connection portion CP. The blocking layer BL may fill the adjacent opening AOP and the central opening COP connected to each other.

The blocking layer BL may be formed by discharging an ink. In one embodiment, for example, the blocking layer BL may be formed by an inkjet printing process. The blocking layer BL may include a polymer resin such as acryl, BCB, or HMDSO. The blocking layer BL may include at least one selected from $TiO_2$, $ZrO_2$, $Al_2O_3$, $In_2O_3$, ZnO, $SnO_2$, $Sb_2O_3$, and ITO. The blocking layer BL may include a solvent-free material that does not contain a solvent. In an embodiment, the blocking layer BL and a functional layer, which will be discharged to the central opening COP, may include a same material as each other.

Referring to FIGS. 10A and 10B, a blocking layer BL formed in a central opening may be removed. In an embodiment, the blocking layer BL formed in a second central opening COP2 may be removed.

A first side surface BLSS1 of the blocking layer BL may be exposed to the outside. The first side surface BLSS1 of the blocking layer BL facing the second central opening COP2 may function as a sidewall. Thus, the blocking layer BL may block a connection from a central opening to an adjacent opening.

Referring to FIG. 10A, in an embodiment, the blocking layer BL formed in the second central opening COP2 may be removed, and the blocking layer BL formed in a connection portion CP and a second adjacent opening AOP2 may remain.

In such an embodiment, the blocking layer BL may be removed by laser radiation. The laser may be radiated to the second central opening COP2. Accordingly, the blocking layer BL filling the second central opening COP2 may be removed. Because a first capping layer CL1 is arranged under the second central opening COP2, damage of a color filter layer 500 and/or a refractive layer RL may be effectively prevented or reduced.

Referring to FIG. 10B, in an alternative embodiment, the blocking layer BL formed in the second adjacent opening AOP2 may be removed, and the blocking layer BL formed in the second central opening COP2 and the second adjacent opening AOP2 may be removed. The blocking layer BL formed in the connection portion CP may remain. The first side surface BLSS1 and a second side surface BLSS2 of the blocking layer BL may be exposed to the outside. The first side surface BLSS1 of the blocking layer BL facing the second central opening COP2 may function as a sidewall.

The second side surface BLSS2 of the blocking layer BL opposite the second adjacent opening AOP2 may function as a sidewall.

In such an embodiment, the blocking layer BL may be removed by laser radiation. The laser may be radiated to the second central opening COP2 and the second adjacent opening AOP2. Accordingly, the blocking layer BL filling the second central opening COP2 and the second adjacent opening AOP2 may be removed. The first capping layer CL1 is arranged under the second central opening COP2 and the second adjacent opening AOP2, and thus, damage of the color filter layer 500 and/or the refractive layer RL may be prevented or reduced.

Hereinafter, for convenience of description, an embodiment where the blocking layer BL formed in the second central opening COP2 is removed and the blocking layer BL formed in the connection portion CP and the second adjacent opening AOP2 remains as shown in FIG. 10A will be described in detail.

Referring to FIGS. 11A and 11B, a functional layer 700 may be formed. The functional layer 700 may be formed on a plurality of central openings COP. The functional layer 700 may be formed in the central opening COP in which a connection to an adjacent opening AOP is blocked by a blocking layer BL. The functional layer 700 may include at least one of a quantum dot and a scatterer. The functional layer 700 may be formed by an inkjet printing process.

In an embodiment, the functional layer 700 may be formed to be spaced apart from the adjacent opening AOP. The functional layer 700 may be formed to be spaced apart from the plurality of adjacent openings AOP. That is, the functional layer 700 may not be formed in the adjacent opening AOP.

A first quantum dot layer 710 may be formed in a first central opening COP1. The first quantum dot layer 710 may fill the first central opening COP1. The first quantum dot layer 710 may include a first quantum dot QD1, a first scatterer SC1, and a first base resin BR1.

A second quantum dot layer 720 may be formed in a second central opening COP2. The second quantum dot layer 720 may fill the second central opening COP2. The second quantum dot layer 720 may fill the second central opening COP2 in which a connection to the second adjacent opening AOP2 is blocked. Thus, the second quantum dot layer 720 may be formed with a preset thickness in the second central opening COP2, and a color conversion function of the second quantum dot layer 720 may be maintained. The second quantum dot layer 720 may include a second quantum dot QD2, a second scatterer SC2, and a second base resin BR2.

A transmission layer 730 may be formed in a third central opening COP3. The transmission layer 730 may fill the third central opening COP3. The transmission layer 730 may include a third scatterer SC3 and a third base resin BR3.

The blocking layer BL and the functional layer 700 may include a same material as each other. In an embodiment, the blocking layer BL and at least one selected from the first quantum dot layer 710, the second quantum dot layer 720, and the transmission layer 730 may include a same material as each other. In one embodiment, for example, the blocking layer BL may include at least one selected from the first quantum dot QD1, the first scatterer SC1, and the first base resin BR1. In an alternative embodiment, the blocking layer BL may include at least one selected from the second quantum dot QD2, the second scatterer SC2, and the second base resin BR2. In another alternative embodiment, the blocking layer BL may include at least one selected from the third scatterer SC3 and the third base resin BR3.

In an embodiment, as described above, the central opening COP and the adjacent opening AOP may be defined in a bank layer 600, and the functional layer 700 may be arranged in the central opening COP of the bank layer 600. In a case of forming the functional layer 700 by discharging an ink through the central opening COP, alignment between an inkjet discharge port (not shown) and the central opening COP may be desired to be accurate. When the inkjet discharge port and the central opening COP are not accurately aligned, the functional layer 700 may be formed on an upper surface 600US of the bank layer 600. In this case, when the color conversion panel 20 and the display panel 10 (see FIG. 3) are bonded together, the functional layer 700 formed on the upper surface 600US of the bank layer 600 may cause damage, such as cracks, of the encapsulation layer 300 (see FIG. 3). In this case, due to the functional layer 700 formed on the upper surface 600US of the bank layer 600, the filler 800 (see FIG. 3) may not be uniformly arranged between the display panel 10 and the color conversion panel 20.

In an embodiment of the disclosure, the central opening COP and the adjacent opening AOP adjacent thereto are defined in the bank layer 600, and thus, the formation of the functional layer 700 on the upper surface 600US of the bank layer 600 may be effectively prevented or reduced. In such an embodiment, even if ink is discharged onto the upper surface 600US of the bank layer 600, the ink may flow into the adjacent opening AOP. Thus, the adjacent opening AOP may prevent the damage of the encapsulation layer 300 and induce the filler 800 (see FIG. 3) to be uniformly arranged.

In an embodiment where the central opening COP and the adjacent opening AOP are defined in the bank layer 600, a portion of the bank layer 600 defining the central opening COP and the adjacent opening AOP may be lost. When a portion of the bank layer 600 is lost, the central opening COP and the adjacent opening AOP may be connected to each other.

In an embodiment, the blocking layer BL is provided to block the connection between the central opening COP and the adjacent opening AOP, the functional layer 700 may be formed with a preset thickness in the central opening COP. Thus, the blocking layer BL may maintain functions of the functional layer 700, and a yield may be maintained by repairing the display device.

In an embodiment, an adjacent opening may overlap a light-shielding portion BP. In an embodiment, the first adjacent opening AOP1 and the second adjacent opening AOP2 may overlap the light-shielding portion BP. The light-shielding portion BP may prevent or reduce the passage of light from the adjacent opening. In one embodiment, for example, even if light is color-converted or transmitted due to a material of the blocking layer BL in the second adjacent opening AOP2, the light-shielding portion BP may prevent or reduce emission of such light. In such an embodiment, the light-shielding portion BP may prevent or reduce color mixing with light passing through the second central opening COP2.

In an embodiment, as described above, a blocking layer of a display device may a block connection from a central opening to an adjacent opening, and a functional layer may fill the central opening in which a connection is blocked. Thus, the functional layer may be filled in the central opening with a constant thickness, and the reliability of the display device may be improved.

In an embodiment of the method of repairing the display device according to the invention, a blocking layer may be formed in a connection portion connecting the central opening and the adjacent opening. Thus, the functional layer may be filled in the central opening with a constant thickness, and the reliability of the display device may be improved.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a lower substrate;
a display element disposed on the lower substrate, wherein the display element comprises an emission layer;
an upper substrate disposed on the lower substrate with the display element therebetween, wherein the upper substrate comprises a central area overlapping the display element and an adjacent area adjacent to the central area;
a bank layer disposed on a lower surface of the upper substrate facing the lower substrate, wherein a central opening overlapping the central area, an adjacent opening overlapping the adjacent area, and a connection portion connecting the central opening and the adjacent opening to each other are defined in the bank layer;
a blocking layer overlapping the connection portion; and
a functional layer comprising at least one selected from a quantum dot and a scatterer, wherein the functional layer fills the central opening in which a connection to the adjacent opening is blocked by the blocking layer.

2. The display device of claim 1, wherein
the central opening comprises a first central opening and a second central opening,
the adjacent opening comprises a first adjacent opening adjacent to the first central opening, and a second adjacent opening adjacent to the second central opening,
the first central opening and the first adjacent opening are separated from each other, and
the second central opening and the second adjacent opening are connected to each other by the connection portion.

3. The display device of claim 1, wherein
the bank layer comprises a first surface and a second surface facing each other and defining the connection portion, and
the blocking layer is in contact with the first surface and the second surface.

4. The display device of claim 1, wherein
the central opening comprises a first central opening, a second central opening, and a third central opening,
the adjacent opening comprises a first adjacent opening adjacent to the first central opening, a second adjacent opening adjacent to the second central opening, and a third adjacent opening adjacent to the third central opening, and
the functional layer comprises a first quantum dot layer filling the first central opening, a second quantum dot layer filling the second central opening, and a transmission layer filling the third central opening.

5. The display device of claim 4, wherein the blocking layer and at least one selected from the first quantum dot layer, the second quantum dot layer and the transmission layer include a same material as each other.

6. The display device of claim 1, further comprising:
a color filter layer disposed between the upper substrate and the bank layer, wherein the color filter layer comprises a first color filter, a second color filter, and a third color filter,
wherein the first color filter, the second color filter, and the third color filter overlap each other,
an overlapping portion of the first color filter, the second color filter and the third color filter defines a light-shielding portion, and
the light-shielding portion overlaps the adjacent opening.

7. The display device of claim 6, further comprising:
a capping layer disposed between the color filter layer and the functional layer.

8. The display device of claim 1, wherein the blocking layer extends from the connection portion to the adjacent opening and fills the adjacent opening.

9. The display device of claim 1, wherein the blocking layer comprises a first side facing the central opening, and a second side facing the adjacent opening.

10. A display device comprising:
a lower substrate;
a display element disposed on the lower substrate, wherein the display element comprises an emission layer;
an upper substrate disposed on the lower substrate with the display element therebetween, wherein the upper substrate includes a central area overlapping the display element and an adjacent area adjacent to the central area;
a bank layer disposed on a lower surface of the upper substrate facing the lower substrate, wherein a plurality of central openings overlapping the central area, a plurality of adjacent openings overlapping the adjacent area and adjacent to the plurality of central openings, and a connection portion connecting one of the plurality of central openings and an adjacent one of the plurality of adjacent openings to each other are defined in the bank layer;
a functional layer filling the plurality of central openings, wherein the functional layer comprises at least one selected from a quantum dot and a scatterer; and
a blocking layer overlapping the connection portion.

* * * * *